United States Patent
Tang et al.

(10) Patent No.: US 10,170,611 B1
(45) Date of Patent: Jan. 1, 2019

(54) T-GATE FIELD EFFECT TRANSISTOR WITH NON-LINEAR CHANNEL LAYER AND/OR GATE FOOT FACE

(71) Applicant: HRL Laboratories, LLC, Malibu, CA (US)

(72) Inventors: Yan Tang, Oak Park, CA (US); Keisuke Shinohara, Thousand Oaks, CA (US); Dean C. Regan, Simi Valley, CA (US); Helen Hor Ka Fung, Agoura Hills, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/192,942

(22) Filed: Jun. 24, 2016

(51) Int. Cl.
*H01L 29/66* (2006.01)
*H01L 29/778* (2006.01)
*H01L 29/423* (2006.01)
*H01L 27/06* (2006.01)

(52) U.S. Cl.
CPC .... *H01L 29/7786* (2013.01); *H01L 29/42376* (2013.01); *H01L 29/66431* (2013.01); *H01L 27/0605* (2013.01)

(58) Field of Classification Search
CPC ..... H01L 29/78; H01L 29/205; H01L 21/338; H01L 21/28; H01L 21/283; H01L 29/423; H01L 29/778; H01L 21/335
See application file for complete search history.

(56) References Cited

U.S. PATENT DOCUMENTS

| | | | |
|---|---|---|---|
| 4,673,960 A | 6/1987 | Chao | |
| 5,298,444 A | 3/1994 | Ristow | |
| 5,538,910 A | 7/1996 | Oku | |
| 5,929,467 A | 7/1999 | Kawai | |
| 6,054,355 A | 4/2000 | Inumiya | |
| 6,150,245 A * | 11/2000 | Asai | H01L 29/66446 257/E21.405 |
| 6,483,135 B1 | 11/2002 | Mizuta | |
| 6,515,320 B1 | 2/2003 | Azuma | |
| 7,015,518 B2 | 3/2006 | Kobayashi | |
| 7,566,918 B2 * | 7/2009 | Wu | H01L 29/402 257/194 |
| 8,237,198 B2 | 8/2012 | Wu | |
| 8,383,471 B1 | 2/2013 | Shinihara | |
| 8,558,281 B1 | 10/2013 | Regan | |
| 8,686,473 B1 | 4/2014 | Micovic | |
| 8,698,201 B1 | 4/2014 | Regan | |
| 8,841,154 B2 | 9/2014 | Yoon | |
| 8,941,118 B1 | 1/2015 | Chu | |
| 8,946,724 B1 * | 2/2015 | Shinohara | H01L 27/0605 257/104 |
| 9,449,833 B1 | 9/2016 | Regan | |
| 9,865,719 B2 * | 1/2018 | Keller | H01L 29/7784 |

(Continued)

OTHER PUBLICATIONS

U.S. Appl. No. 14/101,102, filed Dec. 9, 2013, Regan et. al.

(Continued)

*Primary Examiner* — Ismail Muse
(74) *Attorney, Agent, or Firm* — Ladas & Parry

(57) ABSTRACT

Semiconductor devices, such as transistors, FETs and HEMTs having a non-linear gate foot region and non-linear channel width are disclosed as well as methods of making and using such devices and the operational benefits of the devices.

15 Claims, 15 Drawing Sheets

(56) References Cited

U.S. PATENT DOCUMENTS

| | | | |
|---|---|---|---|
| 2008/0108188 A1* | 5/2008 | Jeong | H01L 29/42316 438/172 |
| 2008/0128753 A1 | 6/2008 | Parikh | |
| 2008/0169474 A1 | 7/2008 | Sheppard | |
| 2008/0258150 A1* | 10/2008 | McCarthy | H01L 21/26546 257/76 |
| 2008/0272397 A1* | 11/2008 | Koudymov | H01L 29/1606 257/192 |
| 2009/0146185 A1* | 6/2009 | Suh | H01L 29/2003 257/194 |
| 2009/0179234 A1* | 7/2009 | Maher | H01L 21/28587 257/256 |
| 2009/0267078 A1* | 10/2009 | Mishra | H01L 29/2003 257/76 |
| 2009/0283756 A1 | 11/2009 | Hellings | |
| 2010/0019279 A1 | 1/2010 | Chen | |
| 2010/0117163 A1 | 5/2010 | Miyashita | |
| 2010/0140660 A1* | 6/2010 | Wu | H01L 29/2003 257/183 |
| 2010/0301395 A1* | 12/2010 | Xu | H01L 29/7784 257/194 |
| 2011/0018040 A1* | 1/2011 | Smith | B82Y 10/00 257/288 |
| 2011/0057232 A1* | 3/2011 | Sheppard | H01L 29/0843 257/194 |
| 2011/0133205 A1* | 6/2011 | Nagahisa | H01L 29/4236 257/76 |
| 2011/0165766 A1* | 7/2011 | Jeong | H01L 29/42316 438/585 |
| 2011/0284865 A1 | 11/2011 | Inoue | |
| 2012/0156836 A1 | 6/2012 | Shealy | |
| 2012/0292665 A1 | 11/2012 | Marino | |
| 2013/0043485 A1 | 2/2013 | Ueno | |
| 2013/0087803 A1 | 4/2013 | Kizilyalli | |
| 2013/0099284 A1* | 4/2013 | Tserng | H01L 29/402 257/194 |
| 2013/0105887 A1 | 5/2013 | Zuniga | |
| 2013/0119400 A1 | 5/2013 | Shinohara | |
| 2013/0214287 A1 | 8/2013 | Okamato | |
| 2013/0334538 A1* | 12/2013 | Saunier | H01L 29/778 257/76 |
| 2014/0027864 A1 | 1/2014 | Zhu | |
| 2014/0054603 A1* | 2/2014 | Wu | H01L 29/2003 257/76 |
| 2014/0091308 A1* | 4/2014 | Dasgupta | H01L 29/7784 257/76 |
| 2014/0264379 A1* | 9/2014 | Kub | H01L 29/41725 257/77 |
| 2014/0306235 A1 | 10/2014 | Decoutere | |
| 2014/0335666 A1* | 11/2014 | Koehler | H01L 29/66462 438/172 |
| 2015/0014696 A1 | 1/2015 | Chen | |
| 2015/0123139 A1* | 5/2015 | Kim | H01L 29/66462 257/76 |
| 2015/0162424 A1* | 6/2015 | Briere | H01L 29/778 257/194 |
| 2016/0372588 A1* | 12/2016 | Mizuno | H01L 29/7787 |
| 2017/0117403 A1* | 4/2017 | Okita | H01L 29/7787 |
| 2017/0194474 A1* | 7/2017 | Shirota | H01L 29/0642 |

OTHER PUBLICATIONS

Isabelle Ferain et al., "Multigate transistors as the future of classical metal-oxide-semiconductor field-effect transistors," Nature vol. 479, 310 (2011).

Jung-Hun Oh et al. "Effects of Multigate-Feeding Structure on the Gate Resistance and RF Characteristics of 0.1-μm Metamorphic High Electron-Mobility Transistors," IEEE Trans. Microw. Theory Tech. vol. 57, 1487 (2009).

S. M. Sze, Kwok K. NG, Physics of Semiconductor Devices (pp. 328-338), 3rd Edition, (2006).

Kang-Sung Lee et al., "35-nm Zigzag T-Gate $In_{0.52}Al_{0.48}As/In_{0.53}Ga_{0.47}As$ Metamorphic GaAs HEMTs With an Ultrahigh $f_{max}$ of 520 GHz," IEEE Electron Device Lett. vol. 28, 672 (2007).

U.S. Appl. No. 14/464, filed Aug. 20, 2014, Shinohara.

Chen, et al., "High-transconductance self-aligned AlGaN/GaN modulation-doped field-effect transistors with regrown ohmic contacts", Appl. Phys. Lett., vol. 73, No. 21 (1998), pp. 3147-3149.

Heikman, et al., "Mass transport regrowth of GaN for ohmic contacts to AlGaN/GaN", Applied Physics Letters, vol. 78, 2001, pp. 2876-2878.

Ho, et al., "Monolithic Integration of HEMTS and Shottky Diodes for Millimeter Wave Circuits," GaAs IC Symposium Proceedings, Proceedings, p. 301-304, 1988.

Hong, et al., "Low-resistance Ohmic contacts for high-power GaN field-effect transistors obtained by selective area growth using plasma-assisted molecular beam epitaxy", Applied Physics Letters 89, (2006), pp. 042101-1 to 04210-3.

Kawai, et al., "AlN/GaN insulated gate heterostructure FET with regrown n+ GaN ohmic contact", Electronics Letters, vol. 34, No. 6,(1998), pp. 592-593.

Micovíc, et al., "GaN HFET for W-band Power Applications", Electron Devices Meeting IEDM (2006), 3 pages.

Moon, et al., "55% PAE and High Power Ka-Band GaN HEMTs With Linearized Transconductance via n+GaN Source Contact Ledge", IEEE Electron Device Letters, vol. 29, No. 8, Aug. 2008, pp. 834-837.

Shinohara, "Scaling of GaN HEMTs and Schottky Diodes for Submillimeter-Wave MMIC Applications," published in IEEE Transactions on Electron Devices, vol. 60, No. 10, Oct. 2013, pp. 2982-2996.

Shinohara, K., et al."GaN HEMTS and Schottky Diodes for Sub-Millimeter-Wave MMICs". IMS/RFIC2013 Workshop, Washington State Convention Center, Seattle, WA. Jun. 3, 2013.

Shinohara, K., et al., "Self-Aligned-Gate GaN-HEMTs with Heavily-Doped n+-GaN Ohmic Contacts to 2DEG" Dec. 2012.

From U.S. Appl. No. 14/464,077 (unpublished, non publication requested), Notice of Allowance dated Aug. 2, 2016.

From U.S. Appl. No. 14/464,077 (unpublished, non publication requested), Office Action dated Jul. 8, 2016.

From U.S. Appl. No. 14/464,077 (unpublished, non publication requested), Office Action dated Apr. 19, 2016.

From U.S. Appl. No. 14/464,077 (unpublished, non publication requested), Office Action dated Oct. 6, 2015.

From U.S. Appl. No. 12/792,529 (now U.S. Pat. No. 8,686,473), Notice of Allowance dated Feb. 27, 2014.

From U.S. Appl. No. 12/792,529 (now U.S. Pat. No. 8,686,473), Notice of Allowance dated Oct. 10, 2013.

From U.S. Appl. No. 12/792,529 (now U.S. Pat. No. 8,686,473), Office Action dated Aug. 27, 2013.

From U.S. Appl. No. 12/792,529 (now U.S. Pat. No. 8,686,473), Office Action dated Jun. 14, 2013.

From U.S. Appl. No. 12/792,529 (now U.S. Pat. No. 8,686,473), Office Action dated Oct. 15, 2012.

From U.S. Appl. No. 12/792,529 (now U.S. Pat. No. 8,686,473), Office Action dated Jun. 21, 2012.

From U.S. Appl. No. 13/310,473 (now U.S. Pat. No. 8,558,281), Notice of Alllowance dated Jun. 6, 2013.

From U.S. Appl. No. 13/310,473 (now U.S. Pat. No. 8,558,281), Office Action dated Jan. 28, 2013.

From U.S. Appl. No. 13/310,473 (now U.S. Pat. No. 8,558,281), Office Action dated Nov. 14, 2012.

From U.S. Appl. No. 13/907,704 (now U.S. Pat. No. 8,946,724), Notice of Allowance dated Sep. 29, 2014.

From U.S. Appl. No. 13/907,704 (now U.S. Pat. No. 8,946,724), Notice of Allowance dated Jun. 6, 2014.

From U.S. Appl. No. 13/907,704 (now U.S. Pat. No. 8,946,724), Office Action dated Mar. 11, 2014.

From U.S. Appl. No. 13/968,185 (now U.S. Pat. No. 8,698,201), Notice of Allowance dated Dec. 6, 2013.

From U.S. Appl. No. 14/101,102 (now U.S. Pat. No. 9,449,833), Notice of Allowance dated May 19, 2016.

From U.S. Appl. No. 14/101,102 (now U.S. Pat. No. 9,449,833), Office Action dated Apr. 21, 2016.

(56) References Cited

OTHER PUBLICATIONS

From U.S. Appl. No. 14/101,102 (now U.S. Pat. No. 9,449,833), Office Action dated Mar. 4, 2016.
From U.S. Appl. No. 14/101,102 (now U.S. Pat. No. 9,449,833), Office Action dated Dec. 10, 2015.
From U.S. Appl. No. 14/101,102 (now U.S. Pat. No. 9,449,833), Office Action dated Aug. 21, 2015.
From U.S. Appl. No. 14/101,102 (now U.S. Pat. No. 9,449,833), Office Action dated Jul. 9, 2015.
From U.S. Appl. No. 14/101,102 (now U.S. Pat. No. 9,449,833), Office Action dated May 5, 2015.
From U.S. Appl. No. 14/101,102 (now U.S. Pat. No. 9,449,833), Office Action dated Oct. 30, 2014.

* cited by examiner

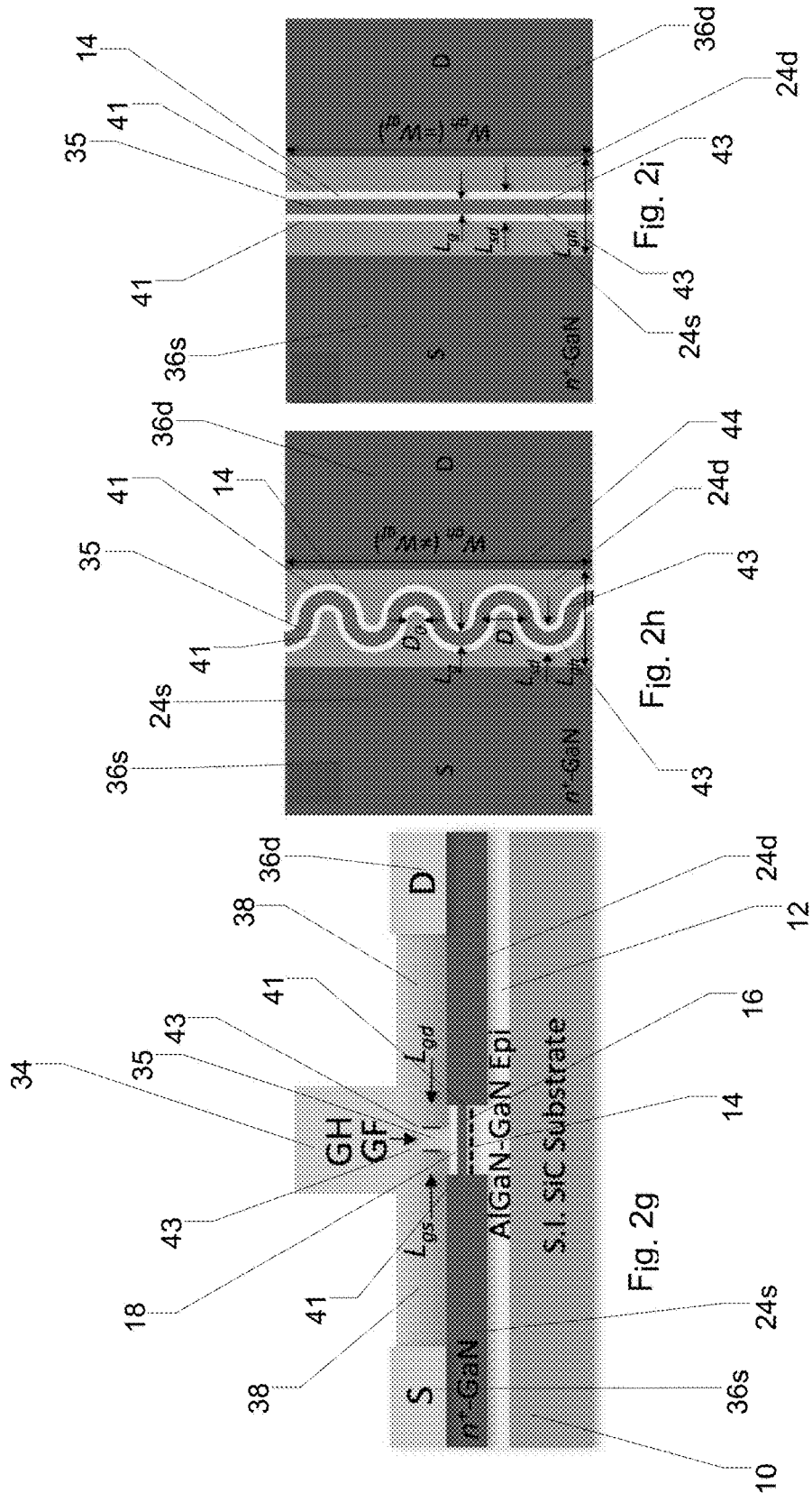

T-GATE FIELD EFFECT TRANSISTOR WITH NON-LINEAR CHANNEL LAYER AND/OR GATE FOOT FACE

NOTICE OF GOVERNMENT FUNDING

This invention was made with government support under the Nitride Electronic NeXt-Generation Technology program awarded by the Defense Advanced Research Projects Agency (DARPA) Microsystems Technology Office under contract HR0011-09-C-0126. The government has certain rights in this invention.

CROSS-REFERENCE TO RELATED APPLICATIONS

This application is related to U.S. patent application Ser. No. 14/101,102, entitled METHODS OF FABRICATING SELF-ALIGNED FETS, filed on Dec. 9, 2013. The disclosure of which, including its description of fabrication steps and materials, device testing and characteristics, and device uses, is incorporated by reference in its entirety.

TECHNICAL FIELD

This disclosure relates to transistors, such as field effect transistors and HEMTs, and in particular those transistors having a non-linear or serpentine gate-foot face and/or a non-linear channel layer in the region of the 2DEG.

BACKGROUND

Shrinking of transistor size can enable smaller, faster, more power-efficient and cost-efficient microelectronic devices. However, as transistor size gets smaller and approaches practical limits, changes to device architecture, such as the design of transistor gates can be used to further improve device performance and provide greater integration density. For example, as transistor size gets smaller, the gate head width (Wgh) will get smaller and the current capacity (Id) and the transconductance (gm) will be reduced while the parasitic capacitance will generally also be reduced and the potential speed of the device increases. Accordingly, to regain current capacity and transconductance lost due to shrinking the size of the device, ways of achieving the effect of a wider gate head are desired without actually increasing the width of the gate head and increasing the size of the transistor.

One approach to improve device performance, such as increasing the current capacity and/or transconductance, can include expanding transistor gate-width such as by multiplying the number of gates, by utilizing multiple gate-fingers, which can boost current and reduce gate resistance. However, such designs can lead to increased parasitic capacitance and can adversely impact high-frequency characteristics of the device. Further, in some cases such approaches can result in a complicated layout and a larger footprint for the resulting device.

Additional approaches for increasing transistor performance are desired.

SUMMARY

In a first embodiment disclosed herein is a transistor gate, the transistor gate comprising: a foot having a first face with a non-linear shape, wherein the non-linear shape comprises a curve.

In a second embodiment disclosed herein is a field effect transistor, the field effect transistor comprising a transistor gate, the transistor gate comprising a foot having a first face with a non-linear shape.

In a third embodiment disclosed herein is a method of making a transistor with a non-linear gate, the method comprising applying a non-linear sacrificial gate to a layer of a FET intermediate; forming one or more layers adjacent at least a portion of the sacrificial gate; removing the sacrificial gate to create a non-linear opening; and metalizing at least a portion of a surface within the opening to form the gate. In an aspect of the third embodiment, the surface which is metalized can be formed within the opening after the sacrificial gate is removed or can be present in the opening upon removal of the sacrificial gate.

In a fourth embodiment disclosed herein is a circuit comprising a field effect transistor, the field effect transistor comprising a transistor gate, the transistor gate comprising a foot having a first face with a non-linear shape.

In a fifth embodiment disclosed herein is a high electron mobility transistor (HEMT) comprising: a source; a drain; a contact ohmic in functional communication with the source; a drain contact in functional communication with the drain; a channel layer extending between the source contact at a first interface and the drain contact at a second interface; and a gate comprising a gate foot, the gate foot located between the first interface and the second interface, and the gate having a curved shape running along the width of the channel layer, the first interface having a curved shape running along the width of the channel layer, the second interface having a curved shape running along the width of the channel layer, the first and second interfaces being substantially parallel to one another, the first interface and the gate being substantially parallel to one another and the second interface and the gate being substantially parallel to one another.

In a sixth embodiment disclosed herein is a method of making a high electron mobility transistor (HEMT) having a non-linear channel layer comprising: applying a non-linear sacrificial gate to a layer of a HEMT intermediate; forming one or more layers adjacent at least a portion of the sacrificial gate; removing the sacrificial gate to create a non-linear opening; and metalizing at least a portion of a surface within the opening to form the gate. In an aspect of the sixth embodiment, the structure which is metalized can be formed in the opening after the sacrificial gate is removed or can be present in the opening upon removal of the sacrificial gate.

In a seventh embodiment disclosed herein is a method of making a high electron mobility transistor (HEMT) having a non-linear channel layer comprising: metallizing at least a portion of a non-linear channel in a semiconductor device, wherein the channel was made by removing a non-linear sacrificial gate previously present on an intermediate form of the semiconductor device.

BRIEF DESCRIPTION OF THE DRAWINGS

FIG. 2a depicts a conventional T-gate GaN-HEMT while

FIGS. 2b and 2c are graphs of measured cutoff frequencies (Ft and Fmax) of the conventional device of FIG. 2a, while

FIG. 2g is a cross-sectional schematic of an HEMT with a symmetric T-shaped gate.

FIG. 2h is a top view schematic of a serpentine foot T-gate.

FIG. 2i is a top view schematic of a straight foot T-gate.

DETAILED DESCRIPTION

Figure 1A:
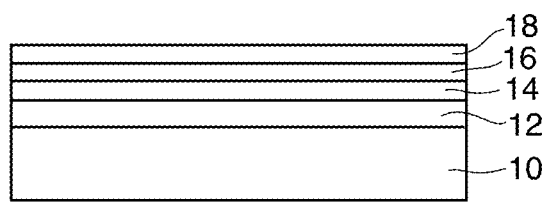
FIGS. 1a-1r depict steps of a fabrication process which may be used to make a device having an asymmetric non-linear self-aligned gate foot face device or a device having a non-linear channel layer/2DEG in accordance with an embodiment of the present invention.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In various embodiments, it has been found that the shape of the gate foot can be something other than a straight line, that the shape of the gate foot can be controlled independently of the shape of the gate head, that the interface between the channel and the source/drain facing the gate can have a shape related to the shape of the gate foot, and that each of these discoveries can result in improved performance of a device embodying one or more of these features.

As discussed herein, the effective width of the gate foot can be independent of the width of the gate head ($W_{gh}$) such as by utilizing a non-linear or curved gate foot where the contour width of the gate foot (as measured following the shape of the gate foot) is greater than the superficial width of the gate (as measured as a straight line from edge to edge) and can be greater than the width of the gate head ($W_{gh}$). This increase in the effective width of the gate foot can lead to improved performance of a device such as by increasing one or more of the current capacity (Id), the transconductance (gm), current gain frequency cutoff (ft), maximum frequency of oscillation (fmax) and/or reducing parasitic gate resistance and parasitic capacitance per unit of gate-foot contour width.

In addition, the effective width of the channel can be increased by utilizing a non-linear or curved interface between the channel and the source and/or drain where the contour width of the channel (as measured following the shape of the channel) is greater than the superficial channel width (as measured as a straight line from edge to edge.) Further, the non-linear or curved channel can be combined with a non-linear or curved gate foot, such as where the shape of the channel is a related shape to the shape of the gate foot.

This use of a non-linear or curved shape for the channel-source/drain interface can lead to a reduction in the length of the channel ($L_{sd}$), and an increase of one or more of the current capacity ($I_d$), the transconductance (gm), current gain frequency cutoff (ft) and maximum frequency of oscillation (fmax) as well as or alternatively reducing parasitic gate resistance and parasitic capacitance per unit of gate-foot contour width.

In some embodiments, the increase in effective width of the gate foot can result in the gate foot following a serpentine or other curved shape under a straight gate head, such as a t-shaped gate head.

Further, various shapes of curves or non-linearities can be used, such as those discussed herein. In some embodiments, shapes of curves or non-linearities and dimensions can be chosen to achieve only some of the advantages described herein while other designs can achieve more of the advantages described herein or can achieve greater advantage in some of the parameters than other designs.

One approach to the design of a channel layer of a transistor, such as a high electron mobility transistor (HEMT), can include the use of a curved interface as a boundary between a channel layer or active portion of a channel layer and one of the source and drain contacts. In some embodiments, the curved interface can be a surface of a source and/or drain contact that forms a boundary to the channel layer. In some embodiments, source and drain contacts can comprise or consist of heavily doped material, such as $n^+$-GaN, or can comprise or consist of a metallic material and can be an ohmic contact. The curved interface can be offset horizontally or horizontally and vertically from a gate foot, which can also have a curved shape. In some embodiments, the gate foot and the interface can be related shapes. "Related shapes" as used herein are those shapes, such as curves or curved surfaces, which are geometrically similar (one can be obtained by uniformly scaling the other), congruent or parallel or where the two shapes are substantially a constant distance apart ("constant distance apart" and "constant distance away" and similar variation in reference to shapes and curved shapes herein means that the distance from each point on the first shape to a corresponding point on the second shape, as measured along a normal of the first shape, is a constant, inflection points can be excluded.) Curves or curved surfaces being parallel means that each point along one curve or curved surface shares a common normal with a point on the other curve or curved surface, however one curve or curved surface can be shorter than the other and in some cases, inflection points can be excluded. Where there is a vertical displacement, or with curved surfaces, projections of the surfaces or curves onto a horizontal plane can be compared for each point sharing a common normal. In some embodiments, the curved interface can be offset horizontally and in some embodiments horizontally and vertically from a gate foot which can have a curved shape which can be a related shape. In some embodiments, the curve of the gate foot can be offset horizontally or horizontally and vertically and can be a related shape to the other of the source and drain contact. An exemplary design of a curved interface can be seen in FIGS. 2g and h, where the contact 24 can be seen extending from each of the source and drain ohmic contacts 36 toward the gate foot 35 with an optional cap layer 18, which is above the channel layer 14, visible between contact 24 and the gate foot 35. The channel boundary 41 can be seen at the interface of the channel layer 14 and the contacts 24. FIG. 2h also shows a source-channel interface 41 and a drain channel interface 41 that are parallel to the gate foot. FIG. 2h also shows a channel 14 with the distance from each point on the source/drain-channel interface 41 being a constant distance away from a corresponding point on the foot 35 and a constant distance from the drain/source-channel interface 41, as measured along a normal to the source/drain-channel interface 41. In some embodiments, the source and/or drain-channel interfaces 41 can have a related shape to the gate foot 35 for only a portion of the width of the gate.

In some embodiments, the channel boundary 41 can be a source boundary facing the transistor gate and/or a drain boundary facing the transistor gate.

In one embodiment, the non-linear shape of the gate-foot 35 can be a serpentine shape, as shown in FIG. 2h. In one embodiment, the non-linear shape of the channel boundary 41 can be a serpentine shape as shown in FIG. 2h.

In some embodiments, the curved shape of a channel boundary 41 can comprise or consist of a series of linked curves, such as linked circular sections, linked half circles, linked elliptical sections, linked half ellipses, linked curves connected through straight sections, and combinations thereof. In some embodiments, a curve can be approximated by a series of angularly linked straight sections. However, in many cases, channel boundary 41 designs which include a series of angularly linked straight sections are not as desirable as a series of linked curves or a series of curves linked through straight sections at least because of the corners which would be present. Such corners can lead to a more uneven electric field along the width of the channel during operation and can in some cases have lower transconductance and lower breakdown field than designs which utilize curves or do not include sharp corners.

In some embodiments, it can be beneficial to provide a constant electron path distance from the channel boundary 41 associated with the source ohmic contact 36s or contact 24s and the channel boundary 41 associated with the drain ohmic contact 36d or contact 24d.

One approach to transistor gate design includes independently controlling gate-foot and gate-head dimensions (Wgf and Wgh) of a transistor gate. Such independent control of dimensions can be applied, for example, to a T-shaped gate, or to other types of transistor gates such as gamma-shaped gates or gate field-plates as well as to devices having a combination of these features.

In one embodiment, the effective gate-foot width can be increased over the "superficial" gate width (the distance from one edge of the gate to the other or one point on the gate to another, measured directly as a straight line) or the gate head dimension by imparting a non-linear shape to the gate-foot. This results in the gate-foot width, measured along and following the contours of the gate foot from one edge to the other or from one point to another (referred to herein as "contour width" of the gate foot), increasing in relation to the superficial gate width or the gate-head width. (See, e.g. FIG. 2h where the gate-foot contour width, Wgf, measured along the gate foot, following the curves, is greater than the superficial gate width 44 or the gate-head width, Wgh, measured as a straight line.) In one embodiment, the non-linear shape of the gate-foot 35 can be a serpentine shape, as shown in FIG. 2h.

In some embodiments, the curved shape of a gate-foot can comprise or consist of a series of linked curves, such as linked circular sections, linked half circles, linked elliptical sections, linked half ellipses, linked curves connected through straight sections, and combinations thereof. In some embodiments, a curve can be approximated by a series of angularly linked straight sections. However, in many cases, gate-foot designs which include a series of angularly linked straight sections are not as desirable as a series of linked curves or a series of curves linked through straight sections at least because of the corners which would be present. Such corners can lead to a more uneven electric field along the width of the channel during operation and can in some cases have lower transconductance and breakdown field than designs which utilize curves or do not include sharp corners.

In some embodiments, it can be beneficial to provide a constant electron path distance from the channel boundary associated with the source or the source contact and the gate-foot and/or from the channel boundary associated with the drain or the drain contact and the gate-foot.

In some embodiments, the source and/or drain contacts and/or contacts can be formed partially, substantially entirely or entirely parallel to the face of the non-linear or serpentine gate-foot. For example, in some embodiments, the source and/or drain ohmic contacts can follow or substantially follow the non-linear or serpentine path of the gate foot for at least a portion of the gate width or for substantially all or for all of the gate width. In some embodiments, the source and/or drain ohmic contacts can take a direct linear path across the device for at least a portion of the gate, such as where distance between the gate foot and one or more of the ohmic contacts changes along the path of the gate foot. In some embodiments, the distance between the gate foot and one ohmic contact can be the same as or different from the distance between the gate foot and the other ohmic contact, such as where these distances are compared on the basis of an average location of the gate foot over a portion or the entire length of the gate foot or at a specific point along the gate foot. In some embodiments, the spacing between the gate foot and each ohmic contact can be symmetric or asymmetric.

In some situations, such an arrangement can provide an equally extended or near equally extended channel width ($W_{ch}$), such as where the channel width is extended a similar amount as the gate foot and has a similar contour width as the gate foot. In some embodiments, a channel can have the distance to one channel boundary different from the distance to the other channel boundary, at a point or on average, and/or having the distance between one or both channel boundary and the gate foot vary along the length of the gate foot.

Compared with a straight gate-foot FET and/or straight channel boundary, a non-linear, curved or serpentine channel boundary and/or non-linear, curved or serpentine gate-foot FET having the same gate-head width (or superficial gate width) can in some embodiments provide one or more advantages such as:

1) Increased drain current ($I_d$) and/or transconductance ($g_m$) (e.g. $I_d$, $g_m \propto W_{gf}$ or $W_{ch}$)

2) Increased high frequency performance, such as related to the current gain frequency cutoff, $f_t$, and/or maximum frequency of oscillation, $f_{max}$, (e.g. $f_t \propto g_m/C_g$, where $C_g$ is the total gate capacitance including any appropriate contributions from the gate-foot ($C_{gf}$), gate-stem ($C_{gst}$) and gate-head ($C_{gh}$), and. $C_g = C_{gf} + C_{gst} + C_{gh}$. $C_{gf}$ or $C_{gst} \propto W_{gf}$, $C_{gh} \propto W_{gh}$. In an embodiment where $W_{gh}$ is held constant while gate foot contour width, $W_{gf}$, increases in the case of a non-linear or serpentine gate-foot, $f_t$ can increase.)

3) Increased transconductance ($g_m$) ($C_{gf}$ $W_{gf}$)

4) Reduced parasitic gate resistance and/or parasitic capacitance per unit gate-foot contour width. (e.g. Gate resistance $\propto W_{gh}$. Parasitic gate capacitance = $C_{gst} + C_{gh}$, where $C_{gst}$ $C_{gst} \propto W_{gf}$, $C_{gh} \propto W_{gh}$.)

5) Increased intrinsic device parameter values such as gate capacitance and/or transconductance proportional to gate-foot contour width while optionally maintaining parasitic gate resistance and/or parasitic capacitance which can be related to gate-head width.

6) Greater mechanical support to the gate-head.

In some embodiments, a non-linear, curved or serpentine channel boundary or gate-foot FET can be achieved having more than one of these advantages.

Embodiments of the non-linear, curved or serpentine channel boundary and/or foot gate technology can be used in the field of GaN electronics and with HFET and MMIC technology including GaN HFET and GaN MMIC technology. Embodiments of the non-linear or serpentine foot gate technology can be applied to high frequency and high power applications such as: phase array radars, Ka-band missile seekers, satellite communication ground terminals, high power GaN devices for cellular base station applications, high voltage devices for switching applications, etc. and other applications as well.

The Examples below describe AlN/GaN/AlGaN-based double heterojunction high electron mobility transistor (HEMT) devices. However, the present disclosure can be applied to other types of FET devices, such as those utilizing III-V semiconductor materials such as GaAs, InP, and InSb, etc. and different types of devices, such as MOSFET, MODFET, MESFET, HEFT. In addition, while the Examples presented below describe using a self-aligned gate process technology, other technologies related to fabrication of gates and the resulting devices can also utilize non-linear or serpentine gate-foot technology such as that described herein.

Example 1. Preparation of Device

An epitaxial heterostructure was grown by metalorganic chemical vapor deposition on a 3-inch semi-insulating SiC wafer. The active region, from bottom to top, consisted of $Al_{0.08}Ga_{0.92}N$ back barrier, 20 nm-thick GaN channel layer, 0.7 nm-thick AlN top barrier, followed by 5 nm $Al_{0.5}Ga_{0.5}N$ cap layer.

Figure 1B:
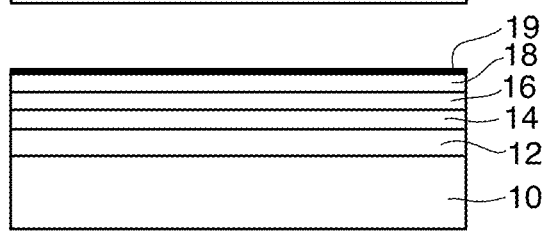
FIG. 1s depicts a symmetric self-aligned gate foot face device in accordance with another embodiment of the present invention which can be attained by omitting certain steps otherwise utilized to make the asymmetric self-aligned gate foot face device embodiment for FIGS. 1a-1r.
Figure 1C:
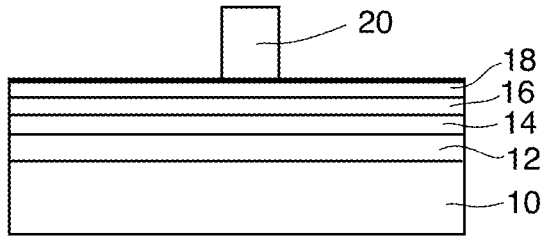
Figure 1D:
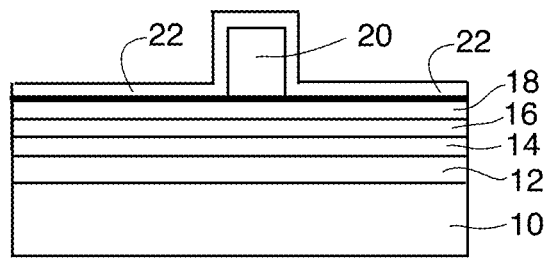
Figure 1E:
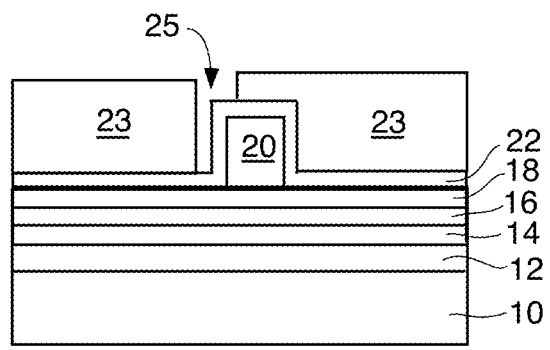
Figure 1F:
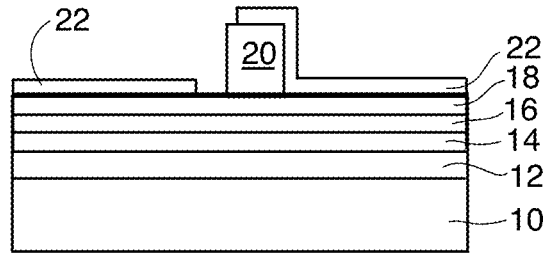
Figure 1G:
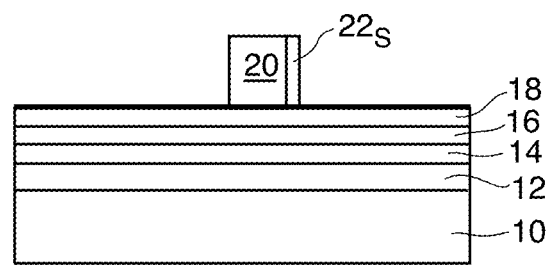
Figure 1H:
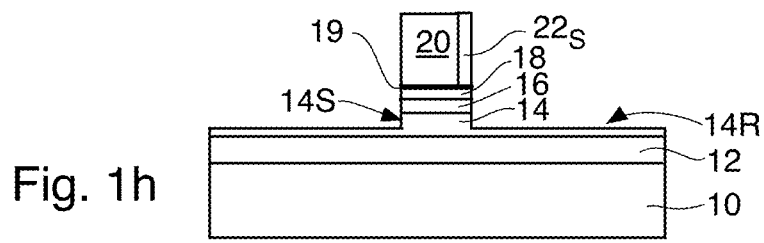
Figure 1I:
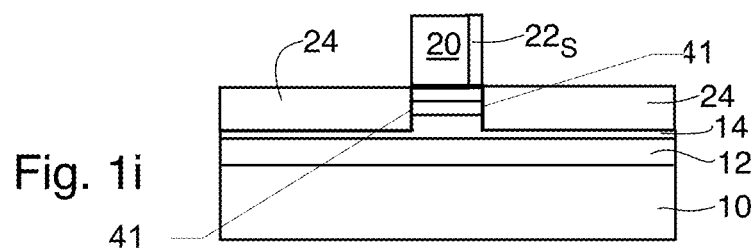
Figure 1J:
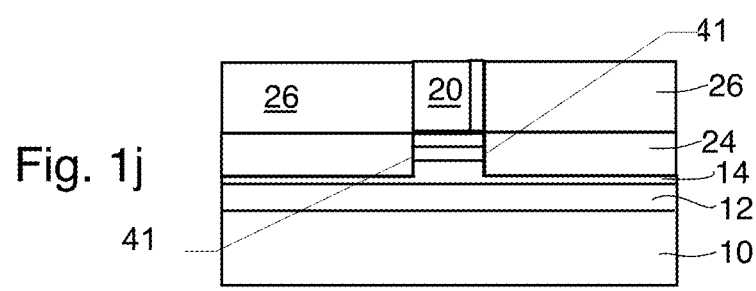
Figure 1K:
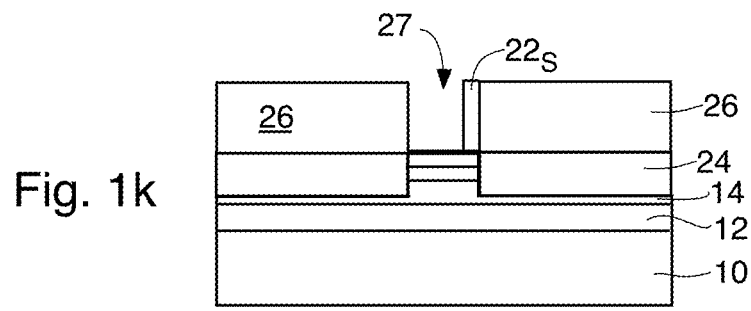
Figure 1L:
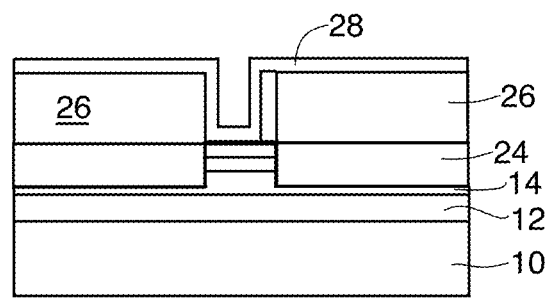
Figure 1M:
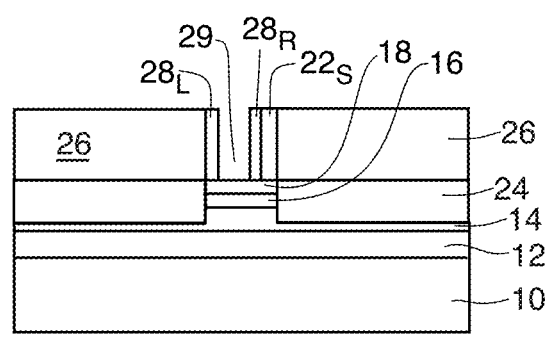
Figure 1N:
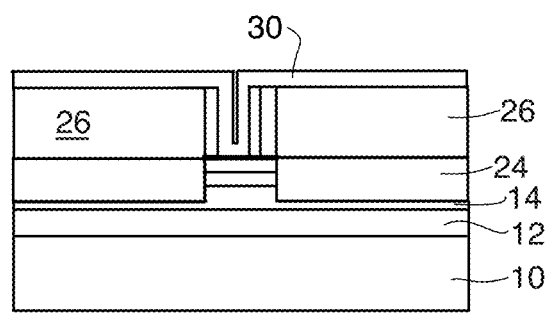
Figure 1O:
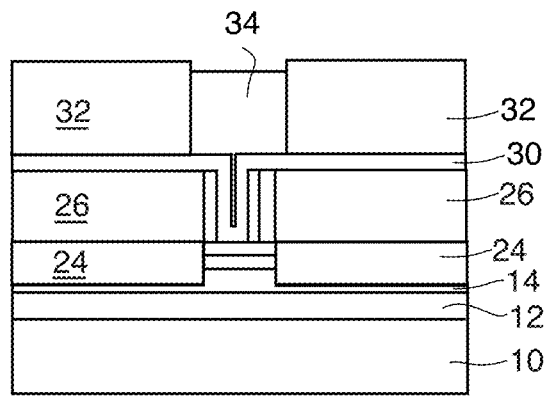
Figure 1P:
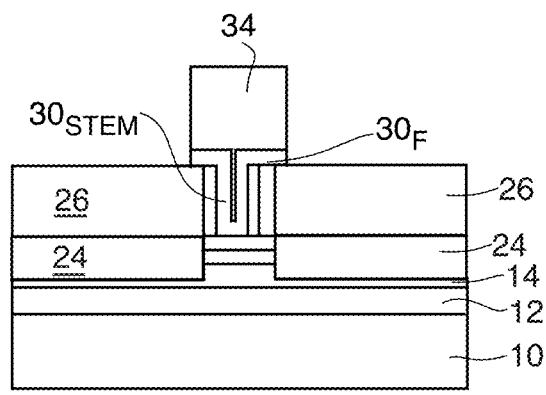
Figure 1Q:
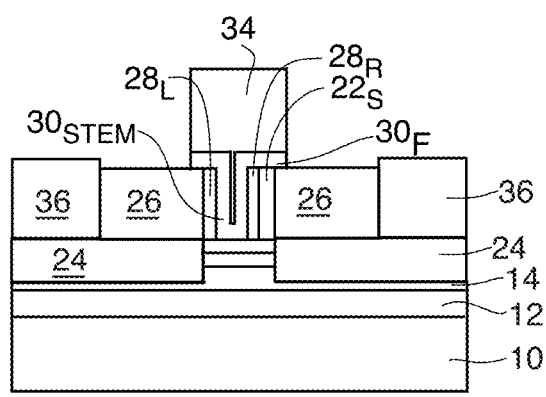
Figure 1R:
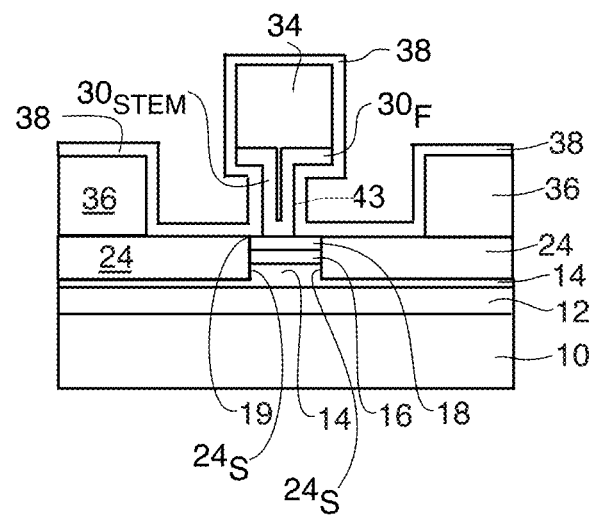

FIGS. 1a-1r show a fabrication process as a sequence of steps which may be used to make a asymmetric (non-symmetric) self-aligned gate stem of a device in accordance with an embodiment of the present invention. This process particularly illustrates a process flow for GaN based HEMT, but it is not limited to GaN but is applicable to other III-V semiconductor material systems such as GaAs, InP, InSb, InGaAs, InAs, GaSb, AlGaN, or InN to name a few. The preferred sequence of fabrication steps is described below.

As shown in FIG. 1a, an embodiment of a GaN-HEMT structure is grown epitaxially preferably by Molecular Beam Epitaxy (MBE) or Metal Organic Chemical Vapor Deposition (MOCVD) on a suitable substrate 10, such as sapphire, SiC, silicon, GaN, etc. The HEMT epitaxial layers preferably comprise an AlGaN back barrier layer 12 disposed on substrate 10, a GaN channel layer 14 disposed on back barrier layer 12, an AlGaN top barrier layer 16 disposed on channel layer 14, and finally an optional epitaxial cap layer 18 applied over the top barrier layer 16 comprising either AlGaN or GaN, all of which layers 12-18 are preferably grown by MBE or MOCVD. Other suitable materials may be utilized for these layers. For example, back barrier layer 12 can alternatively be GaN or InGaN/GaN, channel layer 14 can alternatively be InGaN, AlGaN, or InAlGaN (or combinations thereof) and top barrier layer 16 can alternatively be AlN or InAlN. The thickness of layer 16 is preferably about $\frac{1}{5}$ of the gate length of the HEMT to suppress the short channel effect. The thickness of the layer 14 preferably ranges from about 3 nm to about 40 nm while the thickness of layer 16 preferably ranges from about 1 nm to about 20 nm.

A Two Dimensional Electron Gas (2DEG—see the dashed line in FIG. 2d) occurs in the channel layer 14 due to a polarization effect caused by the top barrier layer 16 or a combination of the top barrier layer 16 and the optional epitaxial cap layer 18. The 2DEG channel is formed immediately at interface between layer 14 and layer 16 as soon as the top barrier 16 is disposed of on top of layer 14 as shown in FIG. 1a.

As shown in FIG. 1b a dielectric layer 19, such as $SiO_2$, SiN, etc., may optionally be applied on top of the optional cap layer 18 (or on top of the top barrier layer 16 if no cap layer is used) using a deposition technique such as plasma enhanced chemical vapor deposition (PECVD) or atomic layer deposition (ALD). Dielectric layer 19 may be used to protect the semiconductor surface (either layer 16 and/or layer 18) thereby preventing a reaction between layer 22 and layer 18 (or layer 22 and layer 16) during the ohmic regrowth step described with reference to FIG. 1j below. A reaction between layer 22 and layer 18 (or layer 16) can form an undesirable current leakage path at the interface. The insertion of a dielectric layer 19 prevents a leakage current from occurring between the gate and the source or the gate and the drain, through this interface, and therefore the use of a dielectric layer 19 is preferred.

Initial patterning is accomplished by laying down a layer of a EBeam resist (preferably hydrogen silsesquioxane (HSQ) is used as the EBeam resist) which is patterned into an island 20 of EBeam resist preferably using E-beam lithography to define the island 20 as shown by FIG. 1c. The thickness of the island 20 is preferably about 3500 Å, while the width of the island 20 (which, as will be seen, helps control the width of the stem of a T-shaped gate) typically should range from about 60 nm to about 200 nm. If desired, $SiO_2$ may be used instead of HSQ as the material to form island 20, but the use of $SiO_2$ will likely involve additional processing steps compared to using HSQ in order to form island 20 as is described herein.

In addition, the shape of island 20 can be controlled to have one or more non-linear sides, such one or more sides which are curved or serpentine or some other shape or combination of shapes. The shape of the sides of island 20 can then be used to form non-linear channel boundaries 41 and/or non-linear gate foot faces 43 (see FIGS. 1r and 1s.)

Next a sacrificial dielectric layer 22 such as Si, $SiO_2$, SiN, SiON, $Al_2O_3$, $HfO_2$, ZrO, $TiO_2$, using a deposition technique such as chemical vapor deposition (CVD) or ALD, is applied over the exposed structure of FIG. 1c resulting in the structure shown by FIG. 1d. This layer 22 will be used to define a sidewall 22S (as explained below—see FIG. 1k) on one side of the stem of the T-shaped gate which sidewall 22S is used to offset the position of the stem asymmetrically. So when forming the sacrificial dielectric layer 22, its thickness (equal to the width of the sidewall 22S) will be used in controlling the size or extent of that offset. The thickness of layer 22 should preferably be in the range of 50 nm to 300 nm.

A mask layer 23 (preferably a PMMA resist) is applied over the structure of FIG. 1d and lithographically patterned preferably using electron beam lithography to define an opening 25 as shown in FIG. 1e. Then the SiN layer 22 visible through opening 25 is etched away preferably using an isotropic dry etch—such as a Reactive Ion Etch (RIE) or an Inductively Coupled Plasma REI (ICP-RIE) etch technique, preferably using a $CF_4$ and $O_2$ gas mixture—through the opening 25 in the resist mask layer 23. This etch may cause layer 22 to etch away partially (not shown in the FIG. 1g) and is preferably timed to not cause any damage to layer 16.

The structure of FIG. 1f is preferably first subjected to an isotropic RIE/ICP RIE etch by a $CF_4/O_2$ gas mixture at high pressure (e.g., 90 mTorr in the etch chamber) to partially etch away layer 22 followed by anisotropic RIE/ICP RIE etch by $CF_4$ gas at a low pressure (e.g., 3 mTorr in the etch chamber) to etch what remains of the SiN layer 22 vertically, leaving behind a sidewall 22S of SiN disposed preferably on the drain side of the gate, as shown in FIG. 1g. This etch will etch island 20 slightly in a vertical direction; however, the lateral width of island 20 will not be changed due by any vertical etching caused by this anisotropic RIE/ICP RIE etch. The resist mask layer 23 is then removed as depicted in FIG. 1f using a suitable mask remover.

The sidewall 22S on what will be the drain side of the gate which is preferably all that remains of the original SiN layer 22 in this embodiment after the isotropic and anisotropic etches of the SiN layer 22 as described above. However, after the processing shown and described with reference to FIG. 1g, the same processing occurring between FIG. 1d and FIG. 1g can be repeated (and modified as need be) to form additional sidewalls on the left-side of the island 20 and on the right-side of sidewall 22S, which additional sidewalls can be used to control an electric field profile between the gate and the source as well as the gate and the drain to increase breakdown voltage or control gate capacitances for improved high frequency performance of the resulting device.

As can be seen by comparing FIG. 1g with FIG. 1h, layers 19, 18, and 16 are next etched away while layer 14 is partially etched in FIG. 1h. An etch depth of 300 Å is targeted using a dry etch, preferably a RIE/ICP RIE etch with a $Cl_2$ gas etchant, which removes layers 19, 18, 16, and partially etches layer 14 using island 20 and its sidewall 22S as a mask. Layer 14 should preferably be partially removed (its thickness is reduced where not protected by island 20 or sidewall 22S) so that contacts 24 of an n+ material can be formed (see FIG. 1i and the discussion below) and make contact to the 2DEG channel of layer 14. The upper exposed portion of channel layer 14 after being reduced in thickness is labeled 14R in FIG. 1h. Moreover the partial etching of channel layer 14 causes a step change in its thickness 14S to occur at the lateral edges of the mask formed by island 20 and its sidewall 22S.

Contacts 24 are formed by selective regrowth of an n+ material (preferably n+GaN). The n+ material (preferably n+GaN) contacts 24 produce lower contact resistances than do conventional alloyed metal contacts and also enable shorter source to drain/gate to gate distances than do conventional alloyed metal contacts. The n+ material (preferably n+GaN) 24 is preferably heavily (or highly) doped with Si (preferably doped with a doping level greater than $5 \times 10^{19}$ $cm^{-3}$) and therefore the heavily (or highly) doped n+ material has a very low resistance allowing it to function as a contact, namely, as a drain contact on the drain side (to the right of island 20 in FIG. 1i) and as a source contact on the source side (to the left of island 20 in FIG. 1i). Due to the low resistance of the Si-doped n+GaN preferably used for contacts 24, the electric field is mostly confined in between the gate and the n+GaN on the drain side of the gate; therefore, a gate-to-drain dimension (Lgd—see FIG. 2d) is defined by the presence of the Si-doped n+GaN 24 on the drain side of the gate.

The n+ material (preferably n+GaN) contacts 24 make contact with layer 14 both where layer 14 is reduced in thickness (see reference numeral 14R in FIG. 1h) and by butting against layer 14 where the step change in thickness occurs (see reference number 14S in FIG. 1h). Contacts 24 may be formed of materials such as n+GaN, n+InN, n+In-GaN and may be formed by MBE or MOCVD. And, as will be seen, metal contacts 36 will be preferably formed on the n+ material contacts 24 during later processing steps. The tops of the n+ material contacts 24 seem to align perfectly with the base of island 20 in FIG. 1i. In practice, the thickness of the n+ material contacts 24 depends the growth rate and growth time of the n+ material and such perfect alignment does not occur. Indeed, we prefer it if the thickness of the n+ material contacts 24 extends about 10 nm above the base of island 20. Then a dielectric layer 26 is deposited, which dielectric layer 26 may comprise Si, SiON, HFO2, ZrO, $TiO_2$, using a deposition technique such as CVD, sputtering, ALD, etc, to a desired thickness which allows for planarization & CMP (Chemical Mechanical Polishing) to planarize the surface to form a smooth outer surface which can seen in FIG. 1j. An annealing step may be optionally used to condense the layer 26 to inhibit it from being significantly etched during the wet etching of island 20 which preferably occurs next. The previously formed sacrificial gate island 20 is removed, preferably by a wet etch, leaving an opening 27 (see FIG. 1k), but this wet etch preferably does not etch the sidewall 22S formed from dielectric layer 22 or layer 26 in any significant way.

A dielectric layer 28, preferably formed of $SiO_2$ and/or SiN is then formed, preferably by PECVD or ALD, on the exposed surface of the structure shown in FIGS. 1k and 1n the previously defined opening 27, as depicted in FIG. 1l. Layer 28 will be used to form a pair of gate sidewall spacers preferably using an anisotropic dry etch (preferably ICP-RIE) to define the two sidewalls (see sidewalls 28L and 28R in FIG. 1m) from the previously deposited dielectric layer 28. This etch (the anisotropic ICP-RIE) also preferably removes layer 19 (if used). This anisotropic etch only etches layer 28 (leaving the new sidewall spacers 28L and 28R behind) and layer 19 (if used) while not etching layer 18 or layer 16 (if optional layer 18 is not utilized) exposing an gate foot opening 29. The thickness of layer 28 should generally be in the range of 10 nm to 100 nm. The anisotropic dry etch is preferably ICP-RIE, using $CF_4$, $CHF_3$, or $SF_6$ gas or some combination thereof as the etchant at a chamber pressure of 3 mTorr at room temperature.

The thickness of layer 22 typically ranges between 50 nm and 300 nm while the thickness of layer 28 typically ranges between 10 nm and 100 nm. The thicknesses of layers 22 and 28 dictate the width of spacers 22S, 28L and 28R shown, for example, in FIG. 1m. The widths selected for these spacers (and hence the thicknesses of layers 22 and 28) will depend on a number of factors, including (i) the width of the gate stem 30STEM (and hence the aspect ratio of the gate stem 30STEM—discussed in the following paragraph), (ii) the width of layers 16 and 18 at the gate foot, and (iii) the degree of asymmetry in terms of the gate stem's location relative to the drain and source contacts 24. As such, the thicknesses of layers 22 and 28 may fall outside the "typical" ranges given above.

The gate foot opening 29 is then metalized by thermal or plasma enhanced ALD using metals such as Pt, Ir for the metallization layer 30 as depicted by FIG. 1n to form metal on the previously exposed portion of the upper barrier layer 16 (or layer 18 if it exists), which metal extends upwardly forming the stem of what will be a T-shaped gate. A very narrow gap can be seen in stem which gap is a possible byproduct of using ALD to form the stem of the gate. If the gate metal is deposited with the thickness more than 0.5× of the size of the gap between sidewalls 28L and 28R, then the depicted narrow gap in the stem is completely eliminated. But if the narrow gap does occur, that gap is later filled with metal (Au) as shown in FIG. 10, when gate head 34 of the T-shaped gate is formed. Either way the resulting stem 30STEM (see, for example, FIG. 1p) can have a high aspect ratio (stem height divided by its width) greater than 10-20 when ALD is used to form the gate stem 30STEM. A high aspect ratio stem (greater than 10) is desirable since that moves gate metal (particularly the gate head 34 discussed in the next paragraph) away from the semiconductor layers (such as the channel layer 14) thereby reducing capacitance between the gate and the semiconductor layers. Using ALD, as discussed herein, to form the gate stem 30STEM allows for much taller gate heights with reduced gate stem widths compared to prior art T-shaped gate construction techniques.

As can be seen by reference to FIG. 10, the gate head 34 is next formed by first applying a mask 32, preferably a PMMA mask, which is patterned using lithographic techniques and an opening formed therein which is then metallized preferably by electro plating using the previously formed metallization layer 30 in the gate foot opening 29 as plating base for this added, new metal which forms the gate head 34. Gate head 34 may be formed of Au and that metal will typically fill in any gap occurring in the stem of the gate. The mask 32 is then removed by a resist remover (stripper) such as Acetone or N-Methylpyrrolidone (NMP). Then the exposed portions of metallization layer 30 are removed, for example, by ion-milling, resulting in the structure depicted by FIG. 1p with the metallic gate foot 30F comprising a portion of the remaining portion of metallization layer 30, particularly the remaining portion of metallization layer 30 which defines the stem 30STEM of a T-shaped gate.

Turning to FIG. 1q, openings for ohmic contacts 36 are preferably defined by first forming openings in dielectric layer 26 using a mask defined using standard lithographic techniques and then employing a RIE/ICP-RIE etch to cut the openings into the dielectric layer 26. Those openings are then filled with metal using standard lithographic techniques, metal evaporation, and lift-off. The metal preferably consists of Au on top of Pt. The gate head is protected with photoresist (not shown) used for the just mentioned mask as the photoresist preferably covers the gate head 34 layer during the opening etching process, as well as the ohmic metal evaporation and lift-off processes used to form the ohmic contacts 36.

Figure 1S:
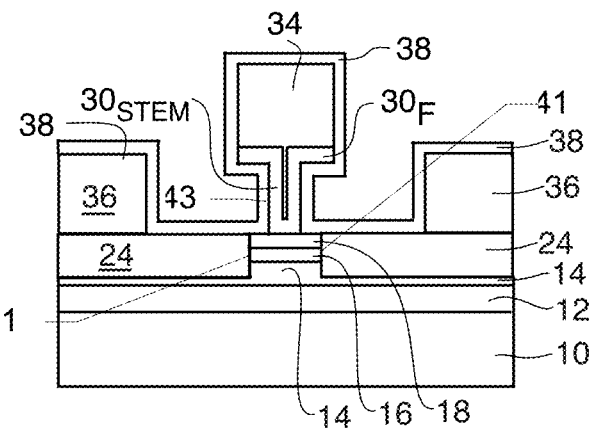

The sidewall spacer 22S, sidewall spacers 28L and 28R and the remaining portions of layer 26 are then preferably removed preferably by a wet etch and a dielectric layer 38 (e.g., a gate dielectric passivation layer 38), preferably formed of SiN, or $Al_2O_3$, or $HfO_2$, or AlN, is then preferably formed over the exposed surfaces preferably by plasma enhanced chemical vapor deposition or atomic layer deposition (ALD) as depicted in FIG. 1s. Since the these layers are all dielectric, they could remain in the finished device, but their presence would then add some capacitance to the resulting device which is likely to be considered as being undesirable in most applications of the device.

It should be noted that the stem 30STEM of the gate foot 30F with left and right gate foot faces 43 is disposed asymmetrically with regard to the sides 24S of the n+regrown layer/contact 24 as can be seen in FIG. 1r. This is due to the fact that more sidewall spacers 22S, 28R (two in this embodiment) are formed on the right hand side of the gate foot opening 29 than are formed on the left hand side of the gate foot opening 29 (where only one sidewall spacer 28L is formed in this embodiment). Of course, the processing described can also form a mirror image of that which is shown in FIG. 1p. With more spacers on the left than occur on the right hand side of FIG. 1p and the processing described can also form a symmetric structure by eliminating the sidewall 22S. It is important, in these asymmetrical embodiments, to have the gate foot (stem) disposed asymmetrically with respect to the sides 24S of layer 24 so that a relatively short gate-to-source distance (the distance between the gate foot and the left side of layer 24 in this embodiment) is used to reduce the source resistance, to increase the drain current, while the relatively longer gate-to-drain distance (distance between the gate foot and the right side of layer 24) is used to increase the breakdown voltage, reduce the gate-to-drain capacitance, and reduce the drain conductance.

Skipping the process steps described with reference to FIGS. 1d-1g (so that that the sidewall spacer 22S shown, for example, in FIG. 1g is not formed) enables the formation of a symmetric self-aligned gate stem as shown in FIG. 1s. The symmetric gate process is suitable for applications such as low-noise amplifier where a very low device on-resistance is required. When the gate stem is symmetric, the breakdown voltage is not as high as the asymmetric gate stem with the relatively longer gate-stem-to-drain distance (compared to the gate-stem-to-source distance). However the symmetric device has smaller drain resistance and a higher cutoff frequency than the asymmetric device, which makes the device more suitable for low DC power, low-noise amplifier applications.

One advantage of the present invention which is applicable to both the asymmetric embodiment of FIG. 1r and the symmetric embodiment of FIG. 1s, is that the location and width of the stem 30STEM of the T-shaped gate is both aligned and controlled by the width of the island 20 and the thicknesses of layer 22 (if used) and layer 28.

Figure 2A:
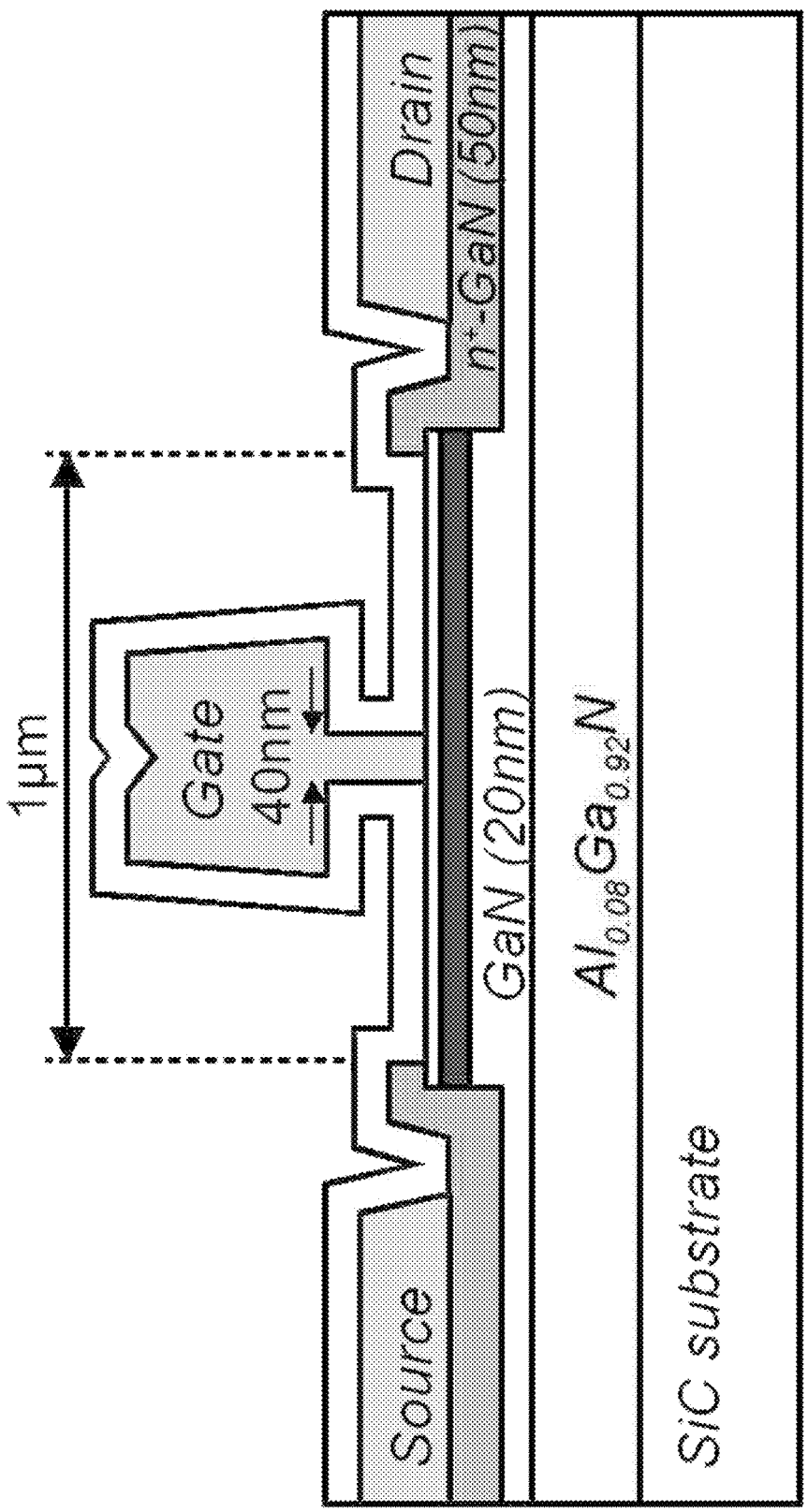
Figure 2B:
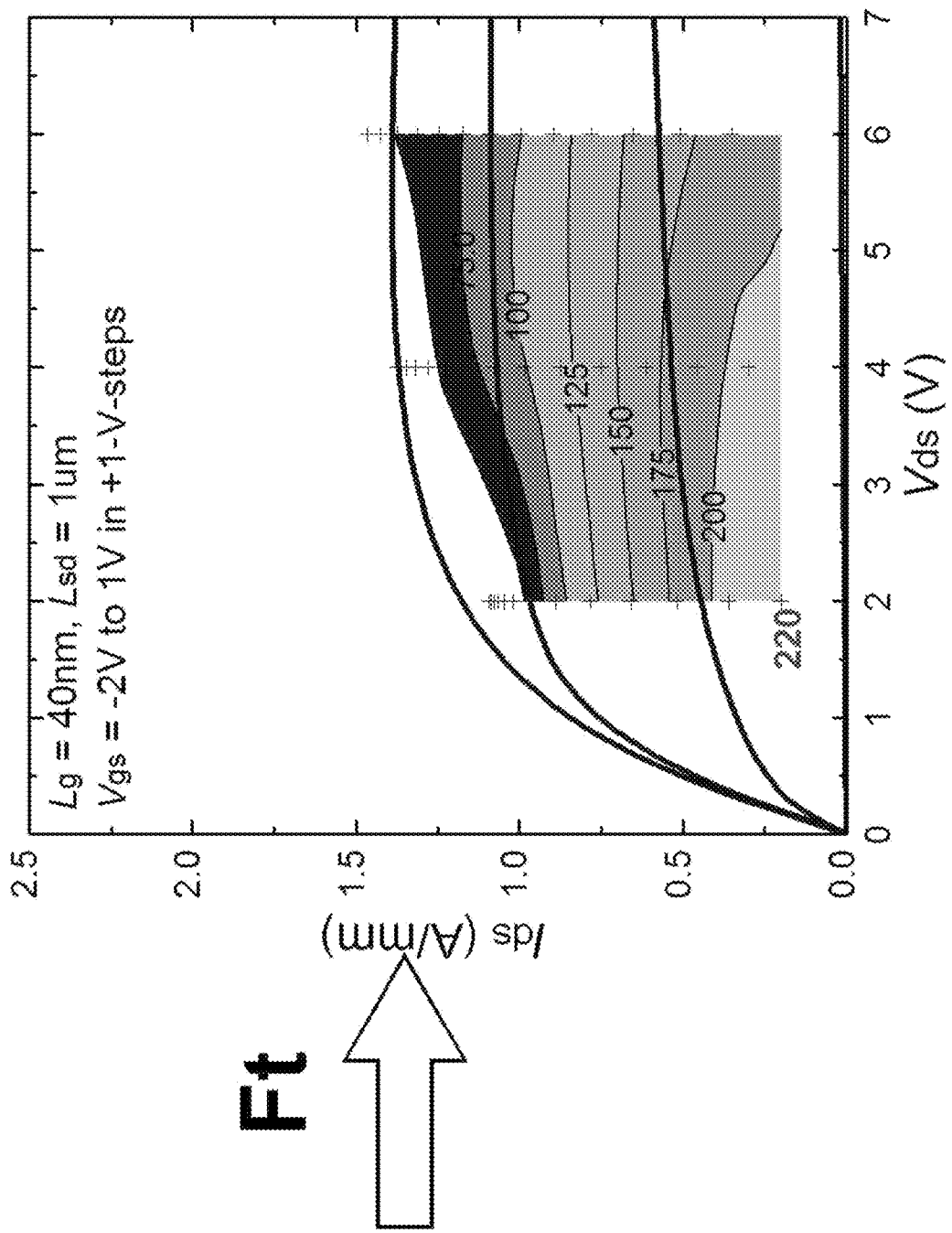
Figure 2C:
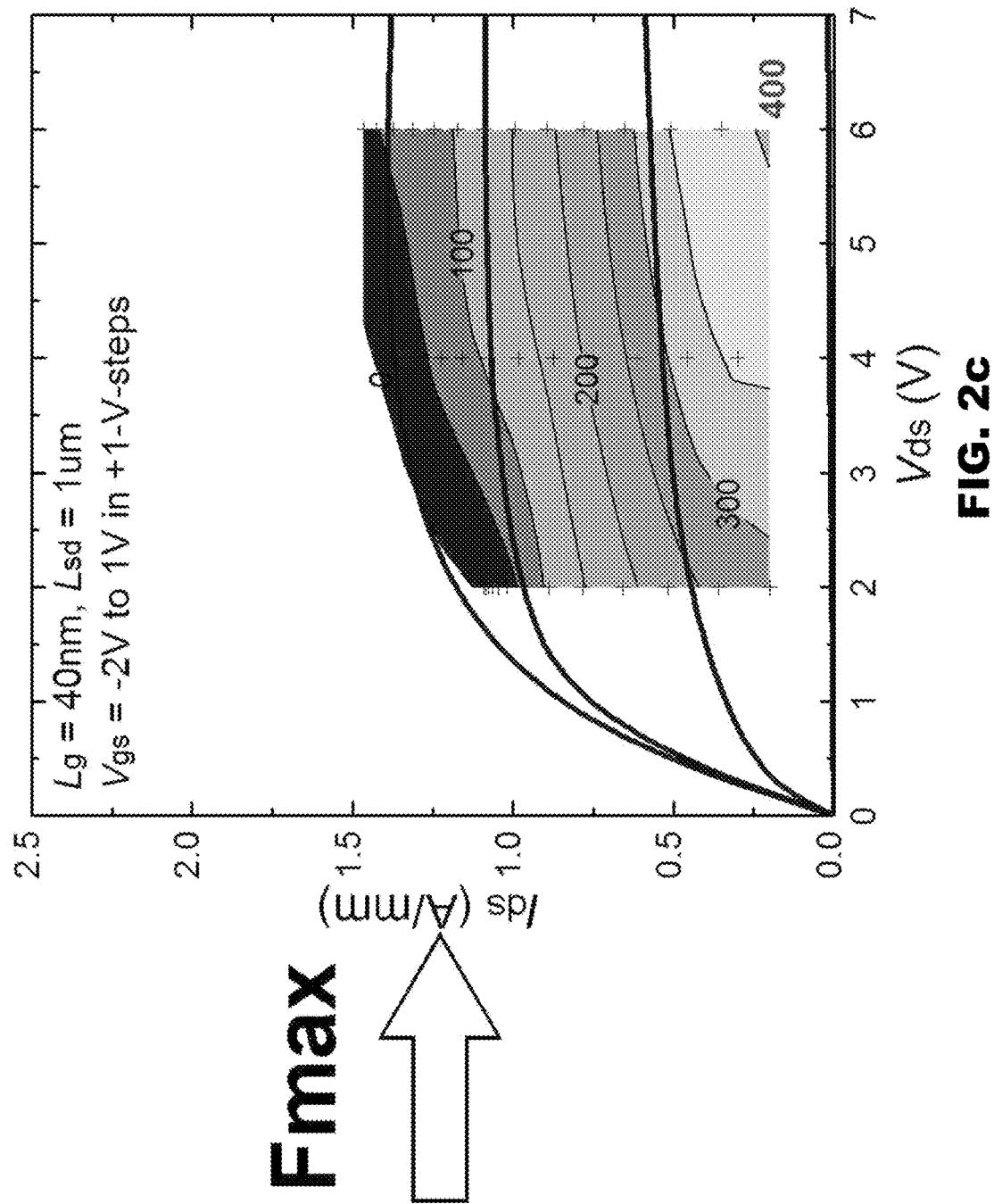
Figure 2D:
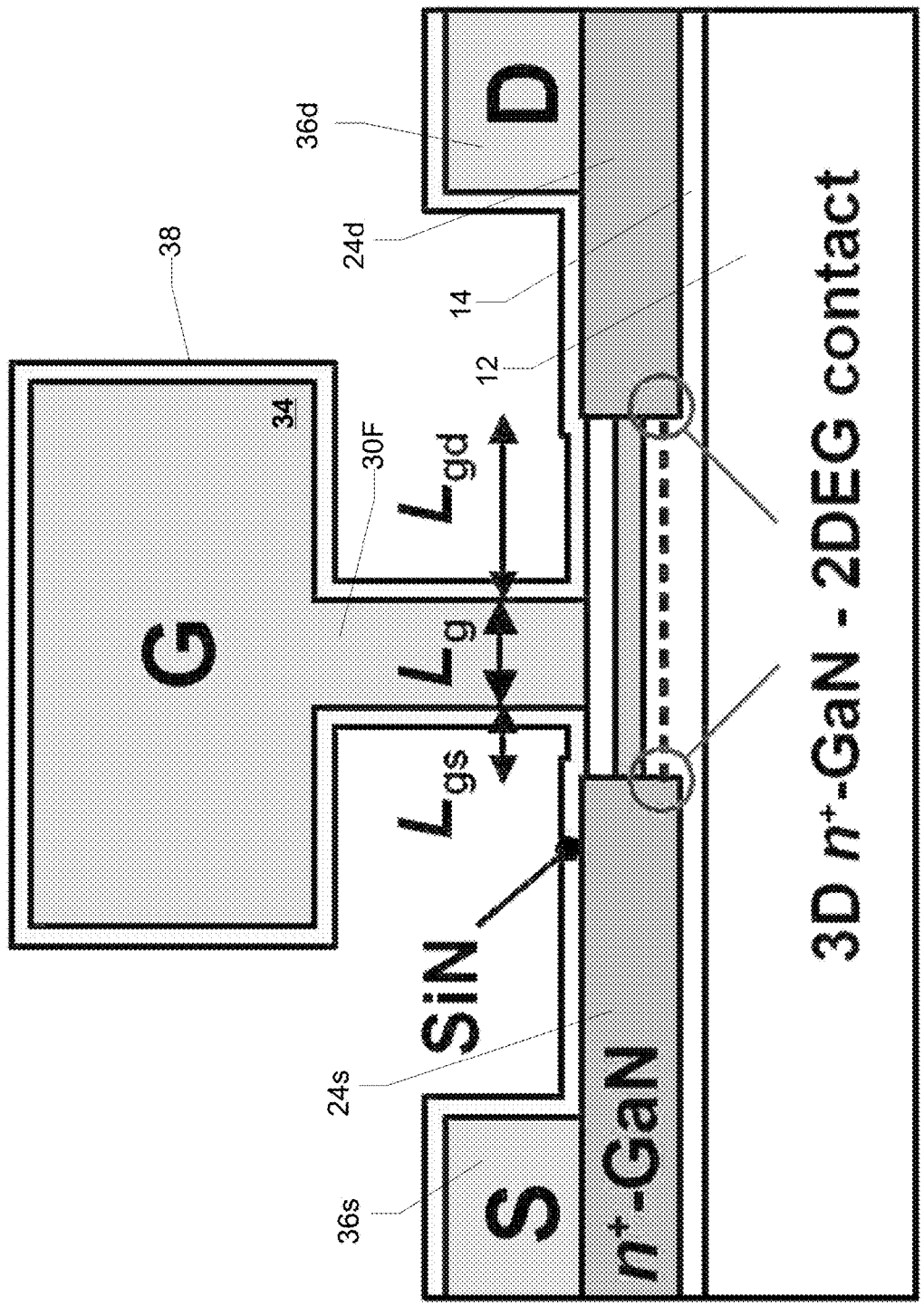
FIG. 2d depicts a GaN-HEMT with an asymmetric self-aligned-gate of an embodiment of the present invention.
Figure 2E:
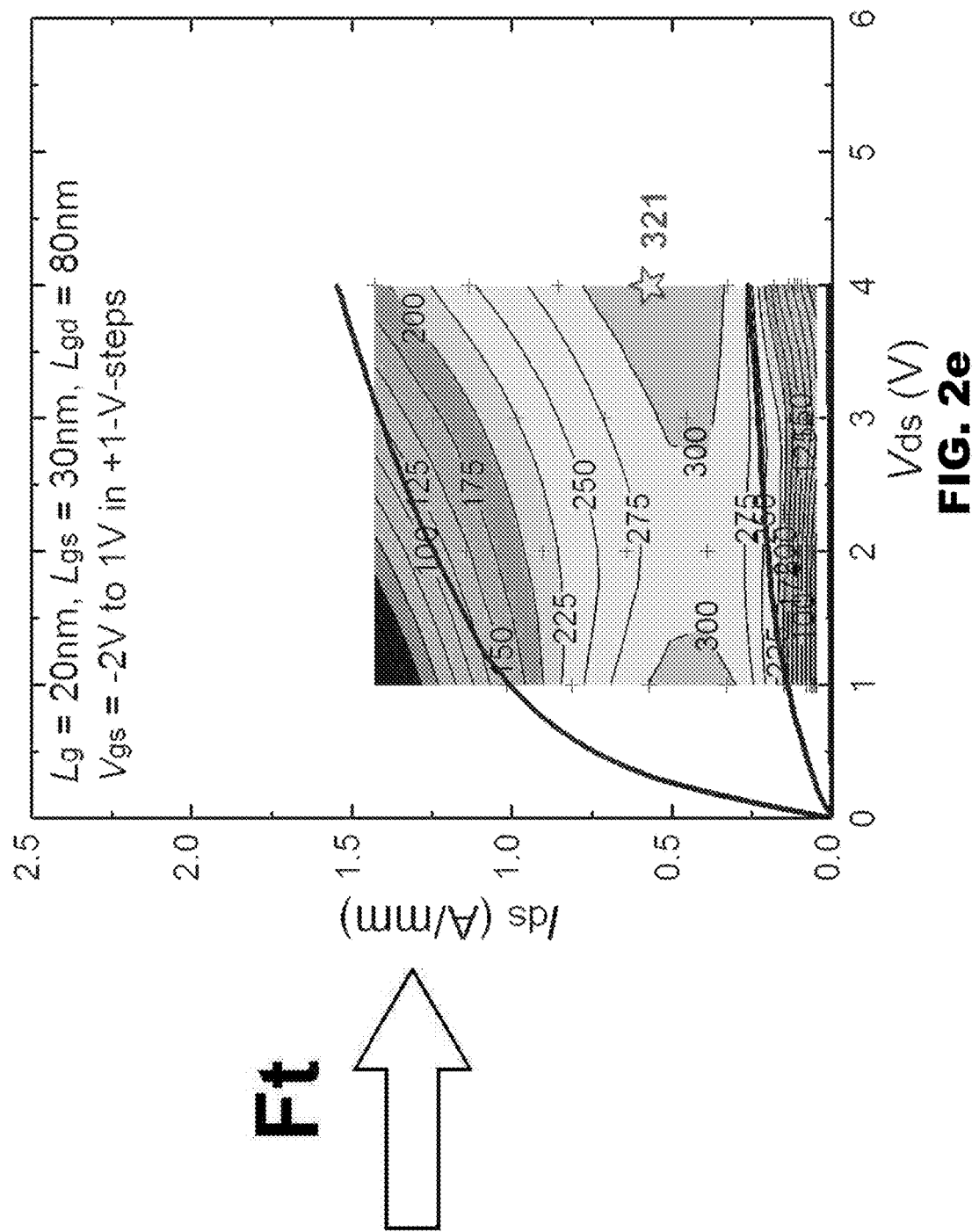
FIGS. 2e and 2f are graphs of measured cutoff frequencies (Ft and Fmax) of an asymmetrical device of FIG. 2d.
Figure 2F:
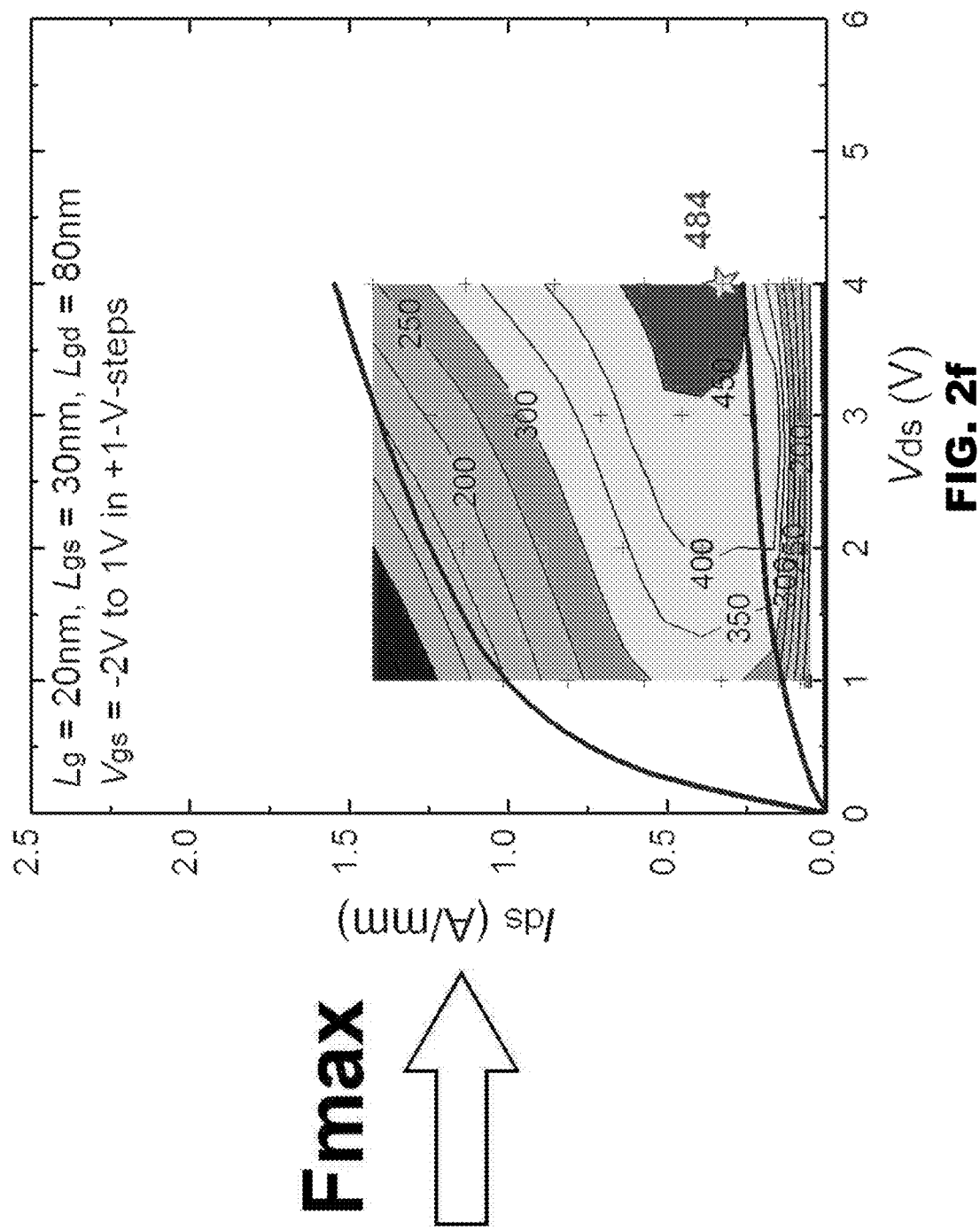

FIG. 2a depicts a conventional T-gate GaN-HEMT while FIG. 2d depicts a GaN-HEMT with an asymmetric self-aligned-gate formed as described above. Under these two figures are graphs of measured cutoff frequencies (Ft and Fmax). FIGS. 2b and 2c are graphs of measured cutoff frequencies (Ft and Fmax) of the conventional device, while FIGS. 2e and 2f are graphs of measured cutoff frequencies (Ft and Fmax) of an asymmetrical (non-symmetrical) device made in accordance with FIGS. 1a-1r. The new asymmetrical device of FIG. 2d shows much improved Ft/Fmax in wide range of drain voltage (Vds) and drain current (Ids), clearly demonstrating advantages of the new device structure and method of making same disclosed herein. The measurements shown in FIGS. 2e and 2f are based on fabricated devices (as opposed to simulations).

In FIG. 2d, Lgs equals the thickness of layer 28 (which is also equal to the width of sidewall 28L, see also FIG. 1m). Lgd equals (i) the thickness of layer 28 (which is also equal to the width of sidewall 28R) plus (ii) the thickness of layer 22 (which is also equal to the width of the additional sidewall 22S). Lg equals the width of the gate foot opening 29. As described above, a longer gate-to-drain distance (Lgd) compared to the gate-to-source distance (Lgs) is utilized to increase breakdown voltage of the asymmetrical gate stem GaN-HEMT disclosed herein. The thickness of layer 22S equals to the difference between Lgs and Lgd as the thicknesses of 28L and 28R are the same in the disclosed embodiment where layer 22 is formed in a single step according to the embodiment disclosed herein. The location of the stem 30STEM of the gate is self-aligned as it is controlled by the thicknesses of layers 22 and 28, while location of n+GaN source and drain contacts 24s and 24d is controlled by the thickness of layer 22.

Incorporated by reference herein (and attached as Appendix A) is a paper entitled "Scaling of GaN HEMTs and Schottky Diodes for Submillimeter-Wave MMIC Applications" published in IEEE Transactions on Electron Devices, vol. 60, no. 10, October 2013, pp. 2982-2996, after the filing date (Mar. 5, 2013) of the provisional application to which benefit is claimed above.

A feature of the asymmetrical gate stem is the formation of more (preferably two) sidewall spacers on one side (preferably the drain side) of the gate stem and fewer (preferably one) sidewall spacer on the other side (preferably the source side) of the gate stem. In the method described above, a single sidewall spacer (22S) is formed immediately after island 20 is defined and then two sidewall spacers (28L and 28R) are defined after the island 20 is removed. Of course this process could be modified to form one sidewall spacer on the source side of the island 20 and two sidewall spacers on the drain side the island 20 (before the island is removed), in which embodiment then there would be no need to form additional sidewall spacers after the island 20 is removed (although they could be formed, in which case the number of sidewall spacers on one side of the gate stem would still be different than the other side). And in yet another embodiment, the process described above with reference to FIGS. 1a-1r could be modified to form one sidewall spacer on the source side after the island 20 is removed and two sidewall spacers on the drain side after the island 20 is removed, in which case there would be no need to form a single sidewall spacer next to the island 20 (before it is removed).

FIG. 2g is a schematic of the cross-section of a GaN HEMT with symmetric T-gate between source and drain contacts 24s and 24d ($L_{gs}=L_{gd}$) produced. FIG. 2g shows a back barrier layer 12 and channel layer 14 on a substrate 10. Source and drain ohmic contacts 36s and 36d and top barrier layer are located on top of the channel layer 14. A dielectric layer 38 and gate head 34 and gate foot 35 and optional cap layer 18 are also shown.

FIGS. 2h and 2i are top view schematics of non-linear/serpentine/curved and straight channel boundary and gate-foot structures on an HEMT. In FIG. 2h, a serpentine gate-foot 35 with gate foot faces 43 composed of repeated half-circular segments, with thickness equal to gate length $L_g$ and center diameter $D=D_0+L_{sd}/2$, where $D_0$ can be variable to adjust the pitch and curvature as shown. Simple calculation shows the contour width of a serpentine foot, with the shape of linked half circles, $W_{gf\_ser}$ is $\pi/2$ (~1.57) times the width of the straight foot (superficial width), $W_{gf\_str}$, or the width of the gate head $W_{gh}$. Also shown are source and drain contacts 24s and 24d, source and drain ohmic contacts 36s and 36d and channel 14 between source and drain ohmic contacts 36s and 36d. In FIG. 2h, a serpentine channel boundary 41 composed of repeated half-circular segments is also shown with channel boundaries 41 on each of the source and drain sides of the device being parallel or substantially parallel to the gate-foot. The contour width of each channel boundary 41 is $\pi/2$ (~1.57) times the width of the width of a straight channel boundary (superficial width).

Example 2—Analysis of Structure of Example 1

The scanning electron micrograph (SEM) in FIG. 3 (a) shows the top view of the sacrificial gate-foot 20 pattern defined by electron-beam lithography, during fabrication of a HEMT of Example 1. The sacrificial gate 20 was utilized as mask for heavily Si-doped n+GaN contacts regrowth via molecular beam epitaxy. The curving shape of the sacrificial gate-foot determines the channel length $L_{sd}$. Orientation of the sacrificial gate 20 with protective dielectric layer (subsequently etched under the gate after sacrificial gate removal (see FIG. 1i) and sidewall spacer deposition (FIG. 1j)) 19 is also shown.

Figures 3A, 3B, 3C:
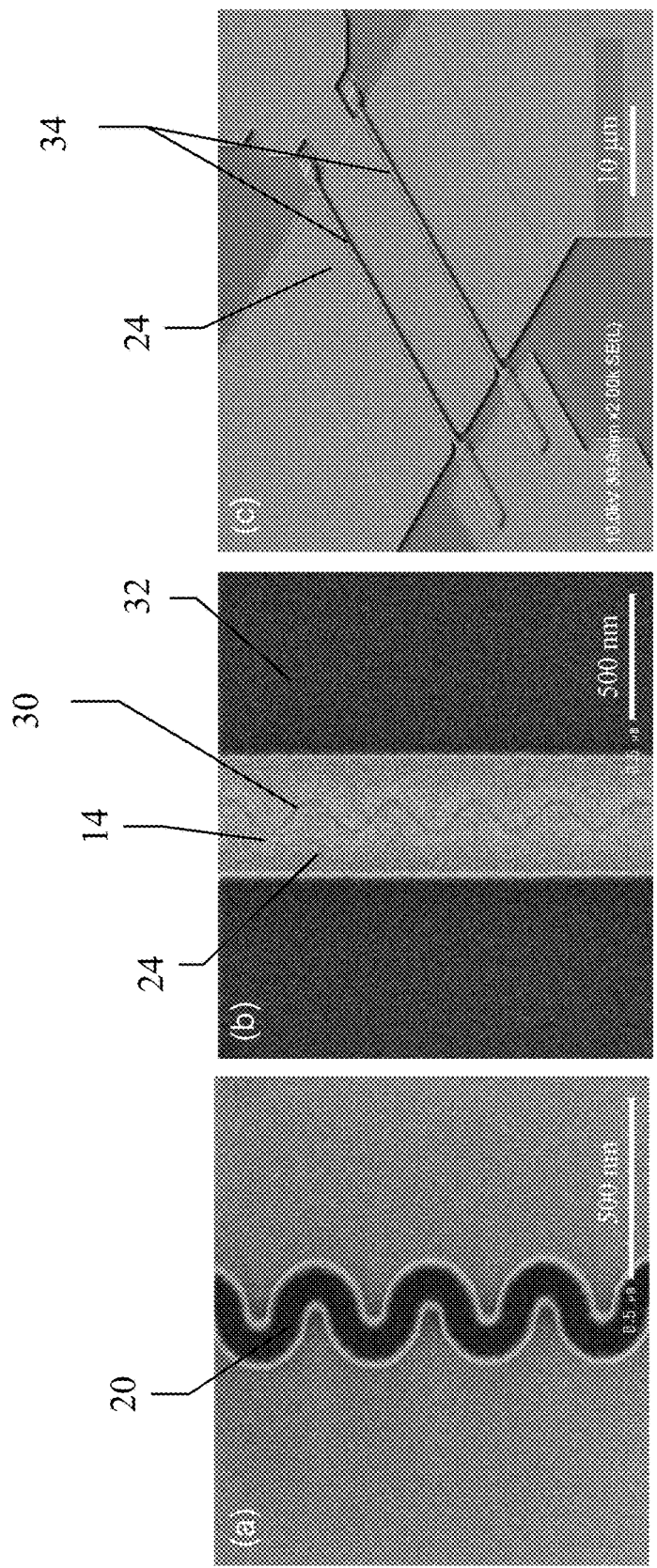
FIG. 3a is a scanning electron micrograph (SEM) of a sacrificial serpentine gate during fabrication.
FIG. 3b is an SEM of a gate-head pattern for a serpentine gate-foot before metallization.
FIG. 3c is an SEM of a HEMT device with double straight 37.5 μm-wide gates.

FIG. 3(b) is an SEM taken before gate-head metallization and with the gate-foot partially metallized, showing alignment between the gate-foot 30 and contacts 24 with interspersal of non-linearities of a separate device from the same wafer as FIG. 3(a.) FIG. 3c is an SEM of another device from the same batch as used for FIGS. 3(a) and 3(b), but from a different wafer, and shows an HEMT device with double straight 37.5 µm-wide gates 34, with the gate width measured at the gate head.

Figure 4:
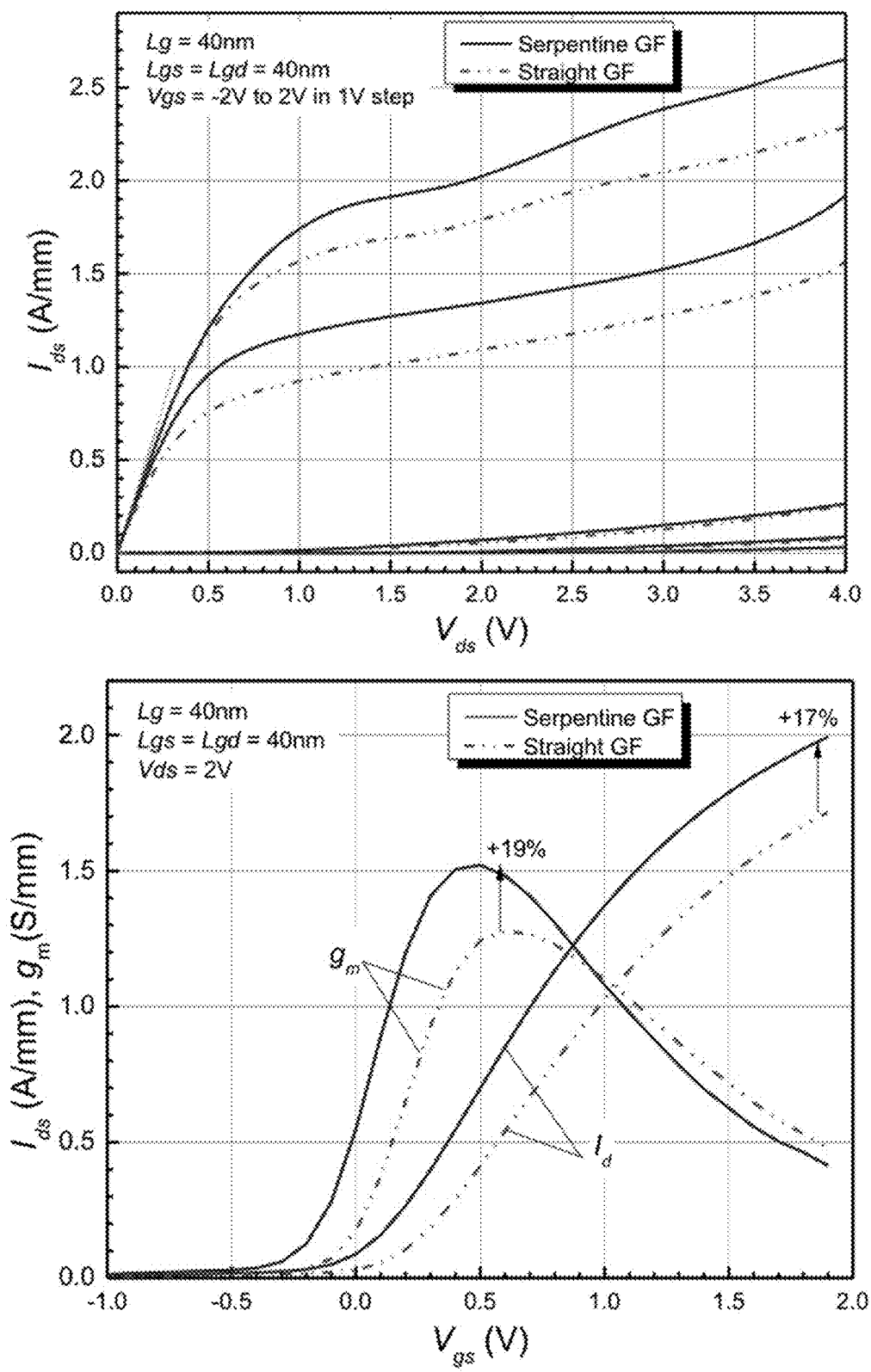
FIG. 4 shows performance characteristics of a non-linear or serpentine gate-foot device and a straight gate-foot device.

FIG. 4 shows the common source DC I-V characteristics of the device having double non-linear or serpentine foot-gates and the operation of the reference device having double straight gates. Both devices have the same gate-length ($L_g$=40 nm), channel length ($L_{sd}=L_{gs}+L_g+L_{gd}$=120 nm) and gate-head width ($W_{gh}$=2×37.5 µm), but different gate-foot designs, and therefore different gate-foot lengths. Both devices exhibit good pinch-off and E-mode device behavior. Maximum drain current $I_{dmax}$ is over 2.65 and 2.25 A/mm for serpentine and straight gate respectively at gate bias $V_{gs}$ of 2V. A 20-25% (or 12-16%) increase in on-current is observed for the serpentine gate at $V_{gs}$ of IV (or 2V). At drain bias $V_{ds}$ of 2V, the peak transconductance $g_m$ measures 1.52 S/mm for the serpentine gate, which is 19% higher than 1.28 S/mm for the straight gate.

The improvements in $I_d$ and $g_m$ for the serpentine gate-foot device can be seen in FIG. 4. Accordingly, devices including non-linear or serpentine gate-foot designs can result in enhanced high-frequency performance and can have increased intrinsic device parameters and can maintain low or reduce parasitic resistances and/or capacitances.

In other embodiments, other shapes can be utilized for a non-linear, curved or serpentine gate-foot structure and/or for a non-linear, curved or serpentine channel boundary, such as sinusoidal, linked partial or half circles, linked partial or half ellipsoids, links of shapes related to higher order polynomials and other equations, square waves, triangular waves including zig-zag, as well as combinations of these shapes, such as where a first portion of the gate foot/channel boundary has one structure and another portion has another (for example, sinusoidal with square waves) and in some embodiments one side of the gate can be different from the other side, such as by varying the shape, the size or the frequency of the pattern of one side as compared to the other side. In some of these and other embodiments, the shape of one side can relate as in parallel to the other or as a mirror-image or be out of phase from the other or be part in/part out of phase and each side can separately or together have a varying wavelength, such as a continuously or intermittently varying wavelength, as well as combinations of these different shapes, variations and relationships as desired. In some embodiments, it can be preferable to utilize shapes which reduce, minimize or eliminate sharp points or corners in the shape of the gate, such as can occur with for example square or triangular waves. In some embodiments, it can be desirable to utilize shapes which include sharp points or corners and it can be advantageous to utilize such a design of a gate foot with a channel interface having a related shape, and it can be further advantageous to utilize a channel interface with a related shape and to reduce the channel length. In some embodiments, it can be desirable to utilize a non-linear gate with a series of rounded bends or curves.

In some embodiments the source and drain boundaries, such as a channel boundary, can be constructed to follow the contour or shape of the gate foot face such as for a portion of the channel width, substantially the entire channel width or the entire channel width. In some embodiments, this technique can allow extension of the channel width by increasing the contour channel width, where $W_{ch}=W_{gf}$, while channel length ($L_{sd}$) is maintained. In some embodiments, the channel length can be increased or decreased along the channel width. In some embodiments, only one of the source and drain boundaries follows the contour or shape of the gate foot face, such as for a portion, substantially the entire channel width or the entire channel width. In various embodiments, the electric field in the channel can take on the non-linear, curved or serpentine shape of the gate-foot curve.

In various embodiments, the drain current, $I_{ds}$, and/or transconductance, $g_m$, can be increased, such as when $W_{gf}$, $L_{sd}$ or the ratio of $W_g/L_{sd}$ is increased.

In various embodiments, the construction of a FET, HFET or HMET can utilize a self-aligned gate process, such as one in which contacts to the channel are formed by epitaxial regrowth of heavily doped GaN, by using a lithographically defined sacrificial gate as a growth mask.

In one embodiment, the drain and/or the source can be constructed so as to have a boundary which follows the shape of the non-linear gate-foot. Alternatively, one or both of the boundaries can be straight while the gate-foot has a non-linear shape. In some embodiments, one or both of the boundaries can have a non-linear shape which follows the non-linear shape of the gate-foot and one or more non-linearities of the gate-foot intersperse with one or more non-linearities of the boundary. In some embodiments, the non-linear gate foot can be located closer to one boundary than the other, such as closer to the source boundary or closer to the drain boundary.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein. As used herein, the language "substantially" generally indicates a degree of variance that a person of skill in the art would understand from the context as not causing a significant degree of change in the performance of the device being described, and includes the possibility of no variation. In the description of shapes, such as the shapes of boundaries, the word "substantially" can indicate that there are short portions at the terminal ends having a different shape, such as straight sections or differently shaped curved sections, and it can indicate that there are intervening sections having a different shape in the midst of a series of shapes describing the shape of the feature. In the context of dimensions including angles, "substantially" generally indicates a small variation in the angle that a person of skill in the art would consider as inconsequential from a performance standpoint, or related to manufacturing tolerances, or as being within 2 or 3 or up to 5% variation.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

Concepts

Concept 1. A transistor gate comprising a foot having a first face with a non-linear shape, wherein the non-linear shape comprises a curve.

Concept 2. The transistor gate of Concept 1, wherein the foot has a second face opposite the first face, and the second face has a non-linear shape.

Concept 3. The transistor gate of Concept 2, wherein the non-linear shape comprises a series of connected curves.

Concept 4. The transistor gate of Concept 3, wherein the series of connected curves comprises a series of connected half-circles.

Concept 5. The transistor gate of Concept 1, wherein the shape of the first face comprises a series of linked curves.

Concept 6. The transistor gate of Concept 5, wherein the curves include half circles.

Concept 7. The transistor gate of Concept 5, wherein the shape of the first face is substantially a series of linked half circles.

Concept 8. The transistor gate of Concept 1, wherein the foot comprises a second face which is substantially parallel to the first face.

Concept 9. The transistor gate of Concept 1, wherein the transistor gate has an effective transistor gate width that is greater than a gate width for a linear gate having a straight gate foot face and the same linear width as the transistor gate.

Concept 10. The gate of Concept 9, wherein the effective gate width is approximately π/2 times the gate width for the gate with the straight gate foot.

Concept 11. A field effect transistor, wherein the transistor comprises the transistor gate of Concept 1.

Concept 12. The transistor of Concept 11, wherein the transistor is a high electron mobility transistor.

Concept 13. The transistor of Concept 11, further comprising a source and a drain, each having a boundary facing the gate, wherein one of the source boundary and the drain boundary has a non-linear shape which follows the non-linear shape of the gate foot.

Concept 14. The transistor of claim 11, further comprising
a source having a source boundary facing the transistor gate; and
and a drain having a drain boundary facing the transistor gate,
wherein one of the source boundary and the drain boundary has a non-linear shape which follows the non-linear shape of the gate foot.

Concept 15. The transistor of Concept 13, wherein both the source boundary and the drain boundary have a non-linear shape which follows the non-linear shape of the gate foot.

Concept 16. The transistor of Concept 11, further comprising a source and a drain, wherein the gate foot is closer to the source than the drain.

Concept 17. The transistor of Concept 11, further comprising a source and a drain, wherein the gate foot is closer to the drain than the source.

Concept 18. A method of making a transistor with a non-linear gate comprising:
applying a non-linear sacrificial gate to a layer of a FET intermediate;
removing the sacrificial gate to create a non-linear channel; and
metallizing at least a portion of the channel.

Concept 19. A method of making a transistor with a non-linear transistor gate comprising:
metallizing at least a portion of a non-linear channel in a semiconductor device, wherein
the channel was made by removing a non-linear sacrificial gate previously present on an intermediate form of the semiconductor device; wherein the.

Concept 20. A circuit having the transistor of Concept 11.

Concept 21. A high electron mobility transistor (HEMT) comprising:
a source;
a drain;
a source contact in functional communication with the source;
a drain contact in functional communication with the drain;
a channel layer extending between the source contact at a first interface and the drain contact at a second interface; and
a gate comprising a gate foot, the gate foot located between the first interface and the second interface, and the gate having a curved shape running along the width of the channel layer, the first interface having a curved shape running along the width of the channel layer, the second interface having a curved shape running along the width of the channel layer, the first and second interfaces having shapes related to one another, the first interface and the gate having shapes related to one another and the second interface and the gate having shapes related to one another.

Concept 22. A high electron mobility transistor (HEMT) comprising:
a source spaced apart from a drain by a distance in a first direction;
a gate disposed between the source and drain extending in a second direction perpendicular to the first direction comprising a gate head and a gate foot; wherein the gate foot comprises a curved section and a contour width of the gate foot is greater than a superficial width of the gate head.

Concept 23. The HEMT of Concept 22 further comprising:
a channel having a source interface and a drain interface facing one another,
wherein the source and drain interfaces have sections with shapes related to the shape of the gate foot.

Concept 24. The HEMT of Concept 23, wherein the source and drain interfaces have sections with shapes that are parallel to the shape of the curved section of the gate foot.

Concept 25. The HEMT of Concept 23, wherein the source interface comprises a section with a shape that is substantially a constant distance from the curved section of the gate foot and the drain interface comprises a section with a shape that is a constant distance from the curved section of the gate foot.

Concept 26. The HEMT of Concept 23, wherein the curve shape of the first interface, the second interface and the gate foot comprises a series of connected half circles.

Concept 27. The HEMT of Concept 23, wherein the curve shape of the first interface, the second interface and the gate foot comprises a series of linked curves.

Concept 28. The HEMT of Concept 23, wherein the curve shape of the first interface, the second interface and the gate foot comprises curves linked through straight sections.

Concept 29. The HEMT of Concept 23, wherein the gate foot is located substantially equidistant from the first interface and the second interface.

Concept 30. The HEMT of Concept 23, wherein the gate foot is located closer to one of the first and second interfaces than the other of the first and second interfaces.

Concept 31. The HEMT of Concept 23, wherein the curved section of the gate foot has a contour width that is approximately $\pi/2$ times a width of a straight section of the gate head having a same superficial width dimension.

Concept 32. The HEMT of Concept 23 further comprising a gate head, the gate head located on the top of the gate foot, wherein a distance from an edge of the gate head facing the drain to an edge of the gate head facing the source is smaller than the channel length.

Concept 33. The HEMT of Concept 23, further comprising a gate head, the gate head located on top of the gate foot, wherein a distance from an edge of the gate head facing the drain to an edge of the gate head facing the source is at least as wide as the channel length.

Concept 34. A method of making a high electron mobility transistor (HEMT) having a non-linear channel layer comprising:
applying a non-linear sacrificial gate to a layer of a FET intermediate;
removing the sacrificial gate to create a non-linear channel; and
metalizing at least a portion of the channel.

Concept 35. A method of making a high electron mobility transistor (HEMT) having a non-linear channel layer comprising:
metallizing at least a portion of a non-linear channel in a semiconductor device, wherein the channel was made by removing a non-linear sacrificial gate previously present on an intermediate form of the semiconductor device.

Concept 36. A circuit having the HEMT of Concept 21.

Concept 37. The circuit of Concept 36, wherein the curved shape of the first interface is substantially a constant distance from the curved shape of the second interface Concept 38. A circuit having the HEMT of Concept 23.

Concept 39. The circuit of Concept 38, wherein the curved shape of the source interface is substantially a constant distance from the curved shape of the drain interface.

Concept 40. The HEMT of Concept 23, further comprising a gate head, the gate head located on top of the gate foot, wherein the gate head is substantially the same width as the channel length.

Concept 41. A transistor gate comprising a gate foot having a first face with a non-linear shape, wherein the non-linear shape comprises a curve.

Concept 42. The transistor gate of Concept 41, wherein the gate foot has a second face opposite the first face, and the second face has a non-linear shape.

Concept 43. The transistor gate of Concept 42, wherein the non-linear shape comprises a series of connected curves.

Concept 44. The transistor gate of Concept 43, wherein the series of connected curves comprises a series of connected half-circles.

Concept 45. The transistor gate of Concept 41, wherein the gate foot comprises a second face which is substantially parallel to the first face.

Concept 46. The transistor gate of Concept 41, wherein the transistor gate has an effective transistor gate width that is greater than a gate width for a linear gate having a straight gate foot face and the same linear width as the transistor gate.

Concept 47. The gate of Concept 42, wherein the effective gate width is approximately $\pi/2$ times the gate width for the gate with the straight gate foot.

We claim:

1. A high electron mobility transistor (HEMT) comprising:
   a source contact spaced apart from a drain contact by a distance in a first direction;
   a gate disposed between the source and drain contacts extending in a second direction perpendicular to the first direction comprising a gate head and a gate foot;
   a first surface and a second surface of a channel;
   a top barrier layer forming a 2DEG in the channel, wherein a surface of the source contact contacts a first surface of the channel and a first surface of the top barrier layer, and a surface of the drain contact contacts a second surface of the channel and a second surface of the top barrier layer, the first surface and the second surface of the channel facing away from one another;
   wherein the gate foot comprises a curved section, and a contour width of the gate foot is greater than a superficial width of the gate head,
   the first and second surfaces of the channel having sections with curved shapes related to the shape of the curved section of the gate foot, and
   the curved section of the gate foot does not include a straight section.

2. The HEMT of claim 1, wherein the first and second surfaces of the channel having sections with shapes that are parallel to the shape of the curved section of the gate foot.

3. The HEMT of claim 1, wherein the first surface of the channel comprises a section with a shape that is substantially a constant distance from the curved section of the gate foot and the second surface of the channel comprises a section with a shape that is substantially a constant distance from the curved section of the gate foot.

4. The HEMT of claim 1, wherein the curve shape of the first surface of the channel, the second surface of the channel and the gate foot comprises a series of connected half circles.

5. The HEMT of claim 1, wherein the curve shape of the first surface of the channel, the second surface of the channel and the gate foot comprises a series of linked curves.

6. The HEMT of claim 1, wherein the curve shape of the first surface of the channel, the second surface of the channel and the gate foot comprises curves linked through straight sections.

7. The HEMT of claim 1, wherein the gate foot is located substantially equidistant from the first surface of the channel and the second surface of the channel.

8. The HEMT of claim 1, wherein the curved section of the gate foot has a contour width that is $\pi/2$ times a width of a straight section of the gate head having a same superficial width dimension.

9. A method of making the high electron mobility transistor (HEMT) of claim 1 comprising:
   metallizing at least a portion of a non-linear channel in a semiconductor device, wherein the channel was made by removal of a non-linear sacrificial gate previously present on an intermediate form of the semiconductor device.

10. A circuit comprising the high electron mobility transistor (HEMT) of claim 1.

11. The HEMT of claim 1, wherein the source contact comprises a doped source contact, the drain contact comprises a doped drain contact, and a bottom of the gate foot is above a region between the doped drain contact and the doped source contact.

12. The HEMT of claim 1, wherein a bottom of the gate foot is above a region between a portion of the source contact and a portion of the drain contact.

13. The circuit of claim 10, wherein the curved shape of the first surface of the channel is substantially a constant distance from the curved shape of the second surface of the channel.

14. A high electron mobility transistor (HEMT) comprising:
   a source contact spaced apart from a drain contact by a distance in a first direction;
   a gate disposed between the source contact and drain contact extending in a second direction perpendicular to the first direction comprising a gate head and a gate foot;
   a channel having a source contact interface and a drain contact interface facing one another;
   wherein the gate foot comprises a curved section, and a contour width of the gate foot is greater than a superficial width of the gate head,
   the source and drain contact interfaces have sections with shapes related to the shape of the curved section of the gate foot, and
   the curved section of the gate foot does not include a straight section,
   wherein the gate foot is located closer to one of the source and drain contact interfaces than another of the source and drain contact interfaces.

15. A high electron mobility transistor (HEMT) comprising:
   a source contact spaced apart from a drain contact by a distance in a first direction;
   a gate disposed between the source and drain contacts extending in a second direction perpendicular to the first direction comprising a gate head and a gate foot;
   a top barrier layer and a channel layer, wherein the top barrier layer forms a 2DEG in the channel layer, and the 2DEG and the top barrier layer contact the source contact and the drain contact,
   wherein the gate foot comprises a curved section, and a contour width of the gate foot is greater than a superficial width of the gate head, a bottom of the gate foot is above the channel layer, and a first edge of the channel layer comprises a curved section that corresponds to and has a shape that is related to the shape of the curved section of the gate foot and a second edge of the channel layer comprises a curved section that corresponds to and has a shape that is related to the shape of the curved section of the gate foot, and the curved section of the gate foot does not include a straight section.

* * * * *